(12) United States Patent
Yamazaki et al.

(10) Patent No.: US 9,184,299 B2
(45) Date of Patent: *Nov. 10, 2015

(54) SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Tokyo (JP); Hiromichi Godo, Kanagawa (JP); Daisuke Kawae, Chiba (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/207,750

(22) Filed: Mar. 13, 2014

(65) Prior Publication Data

US 2014/0191232 A1    Jul. 10, 2014

Related U.S. Application Data

(63) Continuation of application No. 13/753,582, filed on Jan. 30, 2013, now Pat. No. 8,680,521, which is a continuation of application No. 12/954,222, filed on Nov. 24, 2010, now Pat. No. 8,373,203.

(30) Foreign Application Priority Data

Nov. 27, 2009  (JP) ................................. 2009-270809

(51) Int. Cl.
*H01L 29/12* (2006.01)
*H01L 29/786* (2006.01)
*H01L 29/66* (2006.01)

(52) U.S. Cl.
CPC .... *H01L 29/78693* (2013.01); *H01L 29/66969* (2013.01); *H01L 29/7869* (2013.01); *H01L 29/78696* (2013.01)

(58) Field of Classification Search
CPC ..... H01L 29/7869; H01L 29/24; H01L 21/16; H01L 21/00; H01L 21/479
USPC .................. 257/43, 59, 72, 291, 292, E29.151
See application file for complete search history.

(56) References Cited

U.S. PATENT DOCUMENTS 5,731,856 A    3/1998 Kim
5,744,864 A    4/1998 Cillessen
(Continued)

FOREIGN PATENT DOCUMENTS

CN    001786801 A    6/2006
EP    1 737 044 A1   12/2006
(Continued)

OTHER PUBLICATIONS

Chinese Office Action (Application No. 201080053607.6) Dated Jun. 16, 2014.

(Continued)

*Primary Examiner* — Quoc Hoang
(74) *Attorney, Agent, or Firm* — Fish & Richardson P.C.

(57) ABSTRACT

An intrinsic or substantially intrinsic semiconductor, which has been subjected to a step of dehydration or dehydrogenation and a step of adding oxygen so that the carrier concentration is less than $1\times10^{12}/cm^3$ is used for an oxide semiconductor layer of an insulated gate transistor, in which a channel region is formed. The length of the channel formed in the oxide semiconductor layer is set to 0.2 μm to 3.0 μm inclusive and the thicknesses of the oxide semiconductor layer and the gate insulating layer are set to 15 nm to 30 nm inclusive and 20 nm to 50 nm inclusive, respectively, or 15 nm to 100 nm inclusive and 10 nm to 20 nm inclusive, respectively. Consequently, a short-channel effect can be suppressed, and the amount of change in threshold voltage can be less than 0.5 V in the range of the above channel lengths.

19 Claims, 17 Drawing Sheets

(56) References Cited

U.S. PATENT DOCUMENTS

| | | | |
|---|---|---|---|
| 6,294,274 B1 | 9/2001 | Kawazoe | |
| 6,563,174 B2 | 5/2003 | Kawasaki | |
| 6,727,522 B1 | 4/2004 | Kawasaki | |
| 7,038,283 B2* | 5/2006 | Yanai et al. | 257/392 |
| 7,049,190 B2 | 5/2006 | Takeda | |
| 7,061,014 B2 | 6/2006 | Hosono | |
| 7,064,346 B2 | 6/2006 | Kawasaki | |
| 7,105,868 B2 | 9/2006 | Nause | |
| 7,211,825 B2 | 5/2007 | Shih | |
| 7,282,782 B2 | 10/2007 | Hoffman | |
| 7,297,977 B2 | 11/2007 | Hoffman | |
| 7,323,356 B2 | 1/2008 | Hosono | |
| 7,385,224 B2 | 6/2008 | Ishii | |
| 7,402,506 B2 | 7/2008 | Levy | |
| 7,411,209 B2 | 8/2008 | Endo | |
| 7,453,065 B2 | 11/2008 | Saito | |
| 7,453,087 B2 | 11/2008 | Iwasaki | |
| 7,462,862 B2 | 12/2008 | Hoffman | |
| 7,468,304 B2 | 12/2008 | Kaji | |
| 7,501,293 B2 | 3/2009 | Ito | |
| 7,674,650 B2 | 3/2010 | Akimoto | |
| 7,732,819 B2 | 6/2010 | Akimoto | |
| 7,767,106 B2 | 8/2010 | Chang | |
| 7,791,074 B2 | 9/2010 | Iwasaki | |
| 7,935,582 B2 | 5/2011 | Iwasaki | |
| 7,956,361 B2 | 6/2011 | Iwasaki | |
| 8,134,156 B2 | 3/2012 | Akimoto | |
| 8,154,024 B2 | 4/2012 | Iwasaki | |
| 8,158,464 B2 | 4/2012 | Akimoto | |
| 8,158,974 B2* | 4/2012 | Yano et al. | 257/43 |
| 8,368,079 B2 | 2/2013 | Akimoto | |
| 8,373,203 B2* | 2/2013 | Yamazaki et al. | 257/227 |
| 8,421,068 B2 | 4/2013 | Yamazaki | |
| 8,445,902 B2 | 5/2013 | Sato | |
| 8,525,165 B2 | 9/2013 | Akimoto | |
| 8,680,521 B2* | 3/2014 | Yamazaki et al. | 257/43 |
| 8,748,879 B2 | 6/2014 | Yano et al. | |
| 8,779,419 B2 | 7/2014 | Yano et al. | |
| 2001/0046027 A1 | 11/2001 | Tai | |
| 2002/0056838 A1 | 5/2002 | Ogawa | |
| 2002/0132454 A1 | 9/2002 | Ohtsu | |
| 2003/0189401 A1 | 10/2003 | Kido | |
| 2003/0218222 A1 | 11/2003 | Wager | |
| 2004/0038446 A1 | 2/2004 | Takeda | |
| 2004/0127038 A1 | 7/2004 | Carcia | |
| 2005/0017302 A1 | 1/2005 | Hoffman | |
| 2005/0199959 A1 | 9/2005 | Chiang | |
| 2006/0035452 A1 | 2/2006 | Carcia | |
| 2006/0043377 A1 | 3/2006 | Hoffman | |
| 2006/0091793 A1 | 5/2006 | Baude | |
| 2006/0108529 A1 | 5/2006 | Saito | |
| 2006/0108636 A1 | 5/2006 | Sano | |
| 2006/0110867 A1 | 5/2006 | Yabuta | |
| 2006/0113536 A1 | 6/2006 | Kumomi | |
| 2006/0113539 A1 | 6/2006 | Sano | |
| 2006/0113549 A1 | 6/2006 | Den | |
| 2006/0113565 A1 | 6/2006 | Abe | |
| 2006/0118793 A1 | 6/2006 | Yang et al. | |
| 2006/0169973 A1 | 8/2006 | Isa | |
| 2006/0170111 A1 | 8/2006 | Isa | |
| 2006/0197092 A1 | 9/2006 | Hoffman | |
| 2006/0208977 A1 | 9/2006 | Kimura | |
| 2006/0228974 A1 | 10/2006 | Thelss | |
| 2006/0231882 A1 | 10/2006 | Kim | |
| 2006/0238135 A1 | 10/2006 | Kimura | |
| 2006/0244107 A1 | 11/2006 | Sugihara | |
| 2006/0284171 A1 | 12/2006 | Levy | |
| 2006/0284172 A1 | 12/2006 | Ishii | |
| 2006/0292777 A1 | 12/2006 | Dunbar | |
| 2007/0024187 A1 | 2/2007 | Shin | |
| 2007/0046191 A1 | 3/2007 | Saito | |
| 2007/0052025 A1 | 3/2007 | Yabuta | |
| 2007/0054507 A1 | 3/2007 | Kaji | |
| 2007/0072439 A1 | 3/2007 | Akimoto | |
| 2007/0090365 A1 | 4/2007 | Hayashi | |
| 2007/0108446 A1 | 5/2007 | Akimoto | |
| 2007/0152217 A1 | 7/2007 | Lai | |
| 2007/0172591 A1 | 7/2007 | Seo | |
| 2007/0187678 A1 | 8/2007 | Hirao | |
| 2007/0187760 A1 | 8/2007 | Furuta | |
| 2007/0194379 A1 | 8/2007 | Hosono | |
| 2007/0252928 A1 | 11/2007 | Ito | |
| 2007/0272922 A1 | 11/2007 | Kim | |
| 2007/0287296 A1 | 12/2007 | Chang | |
| 2008/0006877 A1 | 1/2008 | Mardilovich | |
| 2008/0038882 A1 | 2/2008 | Takechi | |
| 2008/0038929 A1 | 2/2008 | Chang | |
| 2008/0050595 A1 | 2/2008 | Nakagawara | |
| 2008/0073653 A1 | 3/2008 | Iwasaki | |
| 2008/0083950 A1 | 4/2008 | Pan | |
| 2008/0106191 A1 | 5/2008 | Kawase | |
| 2008/0128689 A1 | 6/2008 | Lee | |
| 2008/0129195 A1 | 6/2008 | Ishizaki | |
| 2008/0166834 A1 | 7/2008 | Kim | |
| 2008/0182358 A1 | 7/2008 | Cowdery-Corvan | |
| 2008/0224133 A1 | 9/2008 | Park | |
| 2008/0237598 A1 | 10/2008 | Nakayama | |
| 2008/0254569 A1 | 10/2008 | Hoffman | |
| 2008/0258139 A1 | 10/2008 | Ito | |
| 2008/0258140 A1 | 10/2008 | Lee | |
| 2008/0258141 A1 | 10/2008 | Park | |
| 2008/0258143 A1 | 10/2008 | Kim | |
| 2008/0296568 A1 | 12/2008 | Ryu | |
| 2009/0068773 A1 | 3/2009 | Lai | |
| 2009/0073325 A1 | 3/2009 | Kuwabara | |
| 2009/0098673 A1 | 4/2009 | Yang et al. | |
| 2009/0114910 A1 | 5/2009 | Chang | |
| 2009/0134399 A1 | 5/2009 | Sakakura | |
| 2009/0152506 A1 | 6/2009 | Umeda | |
| 2009/0152541 A1 | 6/2009 | Maekawa | |
| 2009/0186445 A1 | 7/2009 | Akimoto | |
| 2009/0189155 A1 | 7/2009 | Akimoto | |
| 2009/0278122 A1 | 11/2009 | Hosono | |
| 2009/0280600 A1 | 11/2009 | Hosono | |
| 2010/0003783 A1 | 1/2010 | Akimoto | |
| 2010/0065844 A1 | 3/2010 | Tokunaga | |
| 2010/0092800 A1 | 4/2010 | Itagaki | |
| 2010/0109002 A1 | 5/2010 | Itagaki | |
| 2011/0065216 A1 | 3/2011 | Kaji | |
| 2013/0193434 A1 | 8/2013 | Yamazaki | |

FOREIGN PATENT DOCUMENTS

| | | |
|---|---|---|
| EP | 1 976 018 A2 | 10/2008 |
| EP | 2 226 847 A2 | 9/2010 |
| EP | 2339639 A | 6/2011 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 T | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-245105 A | 9/2006 |
| JP | 2007-096055 A | 4/2007 |
| JP | 2007-103918 A | 4/2007 |
| JP | 2007-123861 A | 5/2007 |
| JP | 2007-165861 A | 6/2007 |
| JP | 2007-220817 A | 8/2007 |
| JP | 2008-042067 A | 2/2008 |
| JP | 2009-135350 A | 6/2009 |
| JP | 2009-212476 A | 9/2009 |

(56) References Cited

FOREIGN PATENT DOCUMENTS

| | | |
|---|---|---|
| JP | 2009-212497 A | 9/2009 |
| JP | 2009-275272 A | 11/2009 |
| TW | 200849604 | 12/2008 |
| WO | WO 2004/114391 A1 | 12/2004 |
| WO | WO-2007/029844 | 3/2007 |
| WO | WO-2007/058329 | 5/2007 |
| WO | WO-2008/136505 | 11/2008 |

OTHER PUBLICATIONS

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In—Ga—Zn-Oxide TFTS With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor,"Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-in. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

PCT Written Opinion (Application No. PCT/JP/2010/069648) mailed Nov. 30, 2010 (4 pages).

International Search Report (Application No. PCT/JP/2010/069648) mailed Nov. 30, 2010 (2 pages).

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays,"AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

(56) References Cited

OTHER PUBLICATIONS

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.
Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.
Ikeda., T et al., "Full-Functional System Liquid Crystal Display Using CG-Silicon Technology," SID Digest '04 : SID International Symposium Digest of Technical Papers, 2004, vol. 35, pp. 860-863.
Janotti, A et al., "Native Point Defects in ZnO," Phys. Rev. B (Physical Review. B), 2007, vol. 76, No. 16, pp. 165202-1-165202-22.
Janotti, A et al., "Oxygen Vacancies in ZnO," Appl. Phys. Lett. (Applied Physics Letters), 2005, vol. 87, pp. 122102-1-122102-3.
Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.
Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.
Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.
Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.
Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.
Kikuchi, H et al., "Polymer-Stabilized Liquid Crystal Blue Phases," Nature Materials, Sep. 1, 2002, vol. 1, pp. 64-68.
Kim, S et al., "High-Performance oxide thin film transistors passivated by various gas plasmas," The Electrochemical Society, 214th ECS Meeting, 2008, No. 2317, 1 page.
Kimizuka, N et al., "Spinel,YBFE2O4, and YB2FE3O7 Types of Structures for Compounds in the IN2O3 and SC2O3—A2O3—BO Systems [A; FE, GA, or AL; B: MG, MN, FE, NI, CU,OR ZN] at Temperatures Over 1000°C," Journal of Solid State Chemistry, 1985, vol. 60, pp. 382-384.
Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.
Kitzerow, H et al., "Observation of Blue Phases in Chiral Networks," Liquid Crystals, 1993, vol. 14, No. 3, pp. 911-916.
Kurokawa, Y et al., "UHF RFCPUS on Flexible and Glass Substrates for Secure RFID Systems," Journal of Solid-State Circuits , 2008, vol. 43, No. 1, pp. 292-299.
Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.
Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.
Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.
Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.
Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.
Meiboom, S et al., "Theory of the Blue Phase of Cholesteric Liquid Crystals," Phys. Rev. Lett. (Physical Review Letters), May 4, 1981, vol. 46, No. 18, pp. 1216-1219.
Miyasaka, M, "Suftla Flexible Microelectronics on Their Way to Business," SID Digest '07 : SID International Symposium Digest of Technical Papers, 2007, vol. 38, pp. 1673-1676.
Mo, Y et al., "Amorphous Oxide TFT Backplanes for Large Size AMOLED Displays," IDW '08 : Proceedings of the 6TH International Display Workshops, Dec. 3, 2008, pp. 581-584.
Nakamura, "Synthesis of Homologous Compound with New Long-Period Structure," NIRIM Newsletter, Mar. 1995, vol. 150, pp. 1-4 with English translation.
Nakamura, M et al., "The phase relations in the In2O3—Ga2ZnO4—ZnO system at 1350° C," Journal of Solid State Chemistry, Aug. 1, 1991, vol. 93, No. 2, pp. 298-315.
Nomura, K et al., "Thin-Film Transistor Fabricated in Single-Crystalline Transparent Oxide Semiconductor," Science, May 23, 2003, vol. 300, No. 5623, pp. 1269-1272.
Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.
Nomura, K et al., "Room-Temperature Fabrication of Transparent Flexible Thin-Film Transistors Using Amorphous Oxide Semiconductors," Nature, Nov. 25, 2004, vol. 432, pp. 488-492.
Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.
Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.
Oba, F et al., "Defect energetics in ZnO: A hybrid Hartree-Fock density functional study," Phys. Rev. B (Physical Review. B), 2008, vol. 77, pp. 245202-1-245202-6.
Liu. G, Microelectronic devices and IC Design, Mar. 31, 2005, pp. 219-222.
Chinese Office Action (Application No. 201080053607.6) Dated Dec. 31, 2014.

* cited by examiner

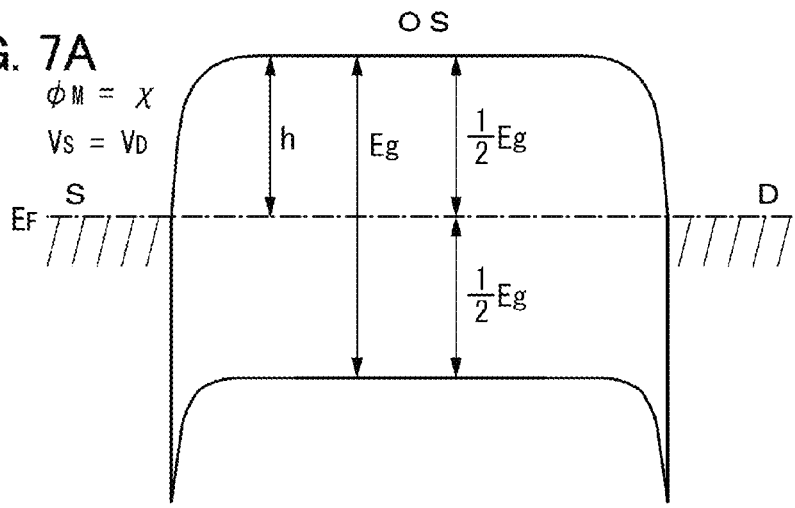
Energy band diagram of an A-A' cross section
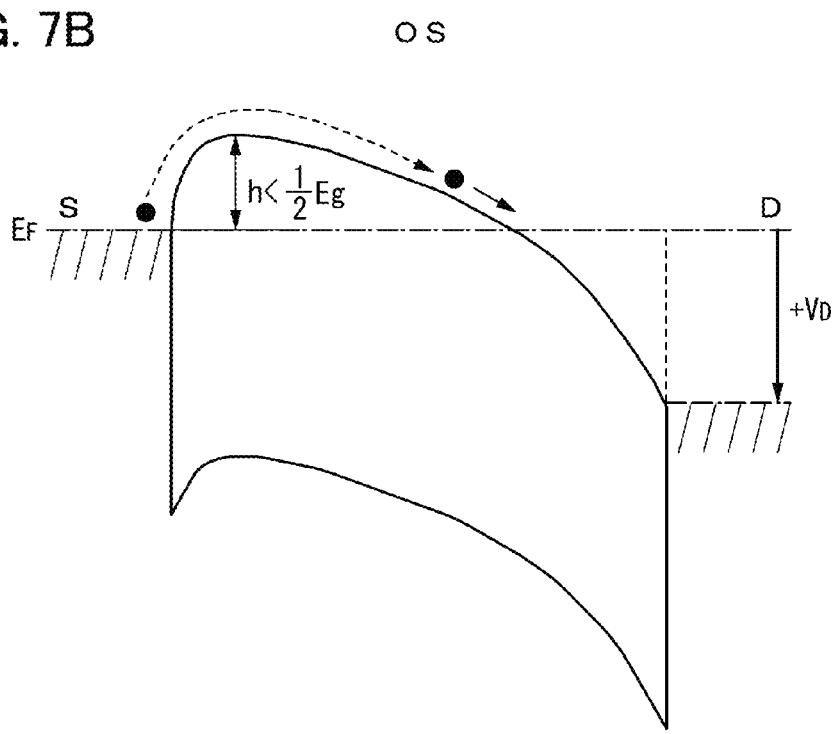
Energy band diagram at the time when a voltage is applied

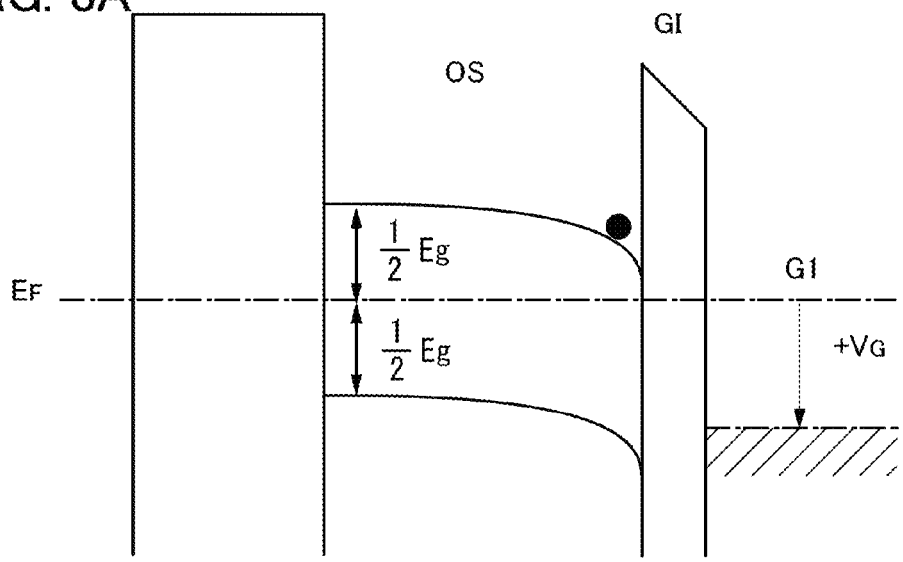
Energy band diagram of a B-B' cross section (+VG)
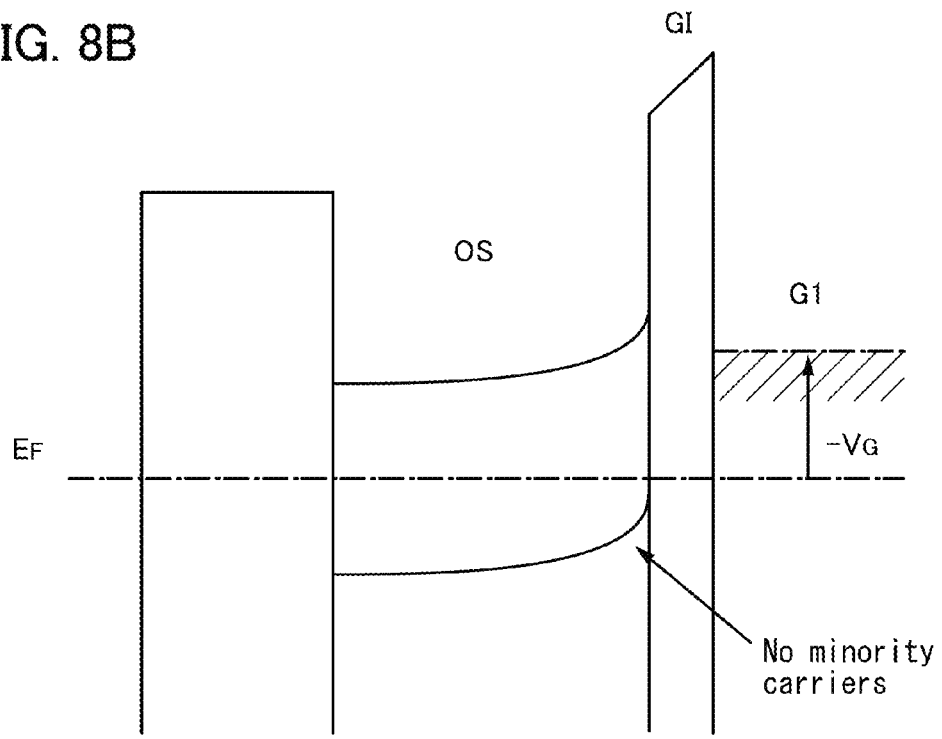
Energy band diagram of a B-B' cross section (-VG)

SEMICONDUCTOR DEVICE

CROSS-REFERENCE TO RELATED APPLICATIONS

This application is a continuation of U.S. application Ser. No. 13/753,582, filed Jan. 30, 2013, now allowed, which is a continuation of U.S. application Ser. No. 12/954,222, filed Nov. 24, 2010, now U.S. Pat. No. 8,373,203, which claims the benefit of a foreign priority application filed in Japan as Serial No. 2009-270809 on Nov. 27, 2009, all of which are incorporated by reference.

TECHNICAL FIELD

The present invention relates to an insulated gate transistor including an oxide semiconductor.

BACKGROUND ART

In recent years, techniques to form insulated gate transistors using a semiconductor thin film (with a thickness of approximately several nanometers to several hundreds of nanometers) which is formed over a substrate having an insulating surface have attracted attention. The insulated gate transistor is widely applied to electronic devices such as an IC and an electro-optical device and has been expected to be rapidly developed particularly as a switching element for an image display device. Various metal oxides exist and are used for a variety of applications. Indium oxide is a well-known material and is used as a transparent electrode material which is necessary for liquid crystal displays and the like.

Some metal oxides have semiconductor characteristics. Examples of such metal oxides having semiconductor characteristics include tungsten oxide, tin oxide, indium oxide, and zinc oxide. Insulated gate transistors in each of which such metal oxide having semiconductor characteristics is used for a channel formation region have already been known (Patent Documents 1 and 2).

REFERENCE

[Patent Document 1] Japanese Published Patent Application No. 2007-123861
[Patent Document 2] Japanese Published Patent Application No. 2007-096055

DISCLOSURE OF INVENTION

An element including an oxide semiconductor has relatively high field-effect mobility and thus can be applied not only to a switching element of a pixel of a display device but also to a driver circuit. Further, an element including an oxide semiconductor can also be applied to a device which conventionally includes a bulk transistor, such as a memory element or an image pickup device.

For any use, an element is desired to be reduced in size in terms of high precision or high integration, and the limit of size reduction needs to be determined in consideration of problems caused by factors combined with a structure, such as a short-channel effect, as well as properties of a material and a physical processing technique.

An object of an embodiment of the present invention is to provide an insulated gate transistor having favorable electric characteristics, in which a short-channel effect can be suppressed to the utmost.

According to an embodiment of the present invention, a highly-purified oxide semiconductor, which has been subjected to a step of dehydration or dehydrogenation and a step of adding oxygen, is used for an oxide semiconductor layer of an insulated gate transistor, in which a channel region is formed.

An oxide semiconductor according to an embodiment of the present invention is a semiconductor which becomes intrinsic or substantially intrinsic by reducing impurities to be electron donors (donors) to a minimum, and has a larger energy gap than a silicon semiconductor. Specifically, the energy gap of an oxide semiconductor is 2 eV or more, preferably 2.5 eV or more, more preferably 3 eV or more.

That is, an embodiment of the present invention is an insulated gate transistor where a channel region is formed using an oxide semiconductor. In the oxide semiconductor, hydrogen or an OH group contained in the oxide semiconductor is removed so that the concentration of hydrogen in the oxide semiconductor is $5\times10^{19}/cm^3$ or less, preferably $5\times10^{18}/cm^3$ or less, more preferably $5\times10^{17}/cm^3$ or less, still more preferably $1\times10^{16}/cm^3$ or less as the minimum measured by secondary ion mass spectrometry (SIMS), and the carrier concentration is less than $1\times10^{12}/cm^3$, preferably less than $1\times10^{11}/cm^3$, more preferably less than or equal to $1.45\times10^{10}/cm^3$, which is an intrinsic carrier concentration of silicon. In silicon or gallium arsenide which is generally used, such an extremely low carrier concentration cannot be achieved even if the concentration of donors or acceptors is sufficiently reduced. That is because the energy gaps of silicon and gallium arsenide are each a little more than 1 eV, and with such a level of energy gap, careers are generated due to thermal excitation at around room temperature. Further, in wide band gap semiconductors such as silicon carbide and gallium nitride, there are significantly few careers generated due to thermal excitation; however, a crystal defect, a local stoichiometric difference, or the like causes generation of carriers. Therefore, in such a semiconductor material, an extremely low carrier concentration cannot be achieved unless the semiconductor material has an ideal crystal with few defects. In other words, an oxide semiconductor used in an embodiment of the present invention can have its career concentration only by having a characteristic of having an energy gap of 2 eV or more, preferably 2.5 eV or more, more preferably 3 eV or more and a characteristic of having no carriers due to a crystal defect or the like, which are characteristics peculiar to an oxide semiconductor. According to findings of the present inventors, in many oxide semiconductors, particularly in an oxide semiconductor containing zinc, impurities do not become donors or acceptors, with a few exceptions such as hydrogen, oxygen, and nitrogen, and the ionization rate of hydrogen is considerably low. It is known that carriers are generated by oxygen vacancy (oxygen deficiency) in these oxide semiconductors, and oxygen vacancy can be eliminated by appropriate heat treatment. That is, according to an embodiment of the present invention, an intrinsic or substantially intrinsic semiconductor with such an extremely low carrier concentration described above can be obtained by setting the concentration of hydrogen in an oxide semiconductor to the level described above and then filling oxygen vacancy (oxygen deficiency) through heat treatment in an oxygen atmosphere.

An oxide semiconductor which has been highly purified in the aforementioned manner is used for a channel formation region of an insulated gate transistor, whereby the insulated gate transistor has an electrical characteristic of normally off; therefore, when the drain voltage is a given voltage within the range of 1 V to 10 V, the off current (the current flowing between a source and a drain when a voltage between a gate and the source is 0 V or less) can be $1\times10^{-13}$ A or less, or the off current density (the numeric value obtained by dividing the off current by the channel width of the insulated gate transistor) can be 100 aA/μm (aA: attoampere, a (atto) means $10^{-18}$ times) or less, preferably 10 aA/μm or less, more preferably 1 aA/μm or less.

Although the significantly low off current characteristic can be obtained as described above, a depletion layer is likely to extend and thus a short-channel effect occurs easily because the channel formation region is formed using such an intrinsic or substantially intrinsic semiconductor with an extremely low carrier concentration. In particular, an oxide semiconductor dealt with in an embodiment of the present invention has a considerably low carrier concentration as pointed out above; thus, even in an insulated gate transistor having a sufficiently long channel length which has not been considered to cause a short-channel effect from general knowledge, a short-channel effect occurs. However, such a fact has not been researched well. The present inventors have found that it is effective to optimize the thicknesses of an oxide semiconductor layer and a gate insulating layer for suppression of such a short-channel effect, as a result of examination in view of the fact. According to an embodiment of the present invention, in an insulated gate transistor with a channel length of 0.2 μm to 3.0 μm inclusive, the maximum of the amount of change in threshold voltage (ΔVth) due to a short-channel effect can be suppressed to less than 0.5 V, preferably 0.25 V or less, more preferably 0.1 V or less.

An embodiment of the invention disclosed in this specification is an insulated gate transistor including a gate electrode layer; a gate insulating layer overlapping with the gate electrode layer; an oxide semiconductor layer overlapping with the gate electrode layer with the gate insulating layer therebetween; source and drain electrode layers overlapping with part of the oxide semiconductor layer; and an oxide insulating layer in contact with the oxide semiconductor layer. The carrier concentration of the oxide semiconductor layer is less than $1\times10^{12}/cm^3$. The length of a channel formed in the oxide semiconductor layer is 0.2 μm to 3.0 μm inclusive. The thickness of the oxide semiconductor layer is 15 nm to 30 nm inclusive. The thickness of the gate insulating layer is 20 nm to 50 nm inclusive.

Another embodiment of the invention disclosed in this specification is an insulated gate transistor including a gate electrode layer; a gate insulating layer overlapping with the gate electrode layer; an oxide semiconductor layer overlapping with the gate electrode layer with the gate insulating layer therebetween; source and drain electrode layers overlapping with part of the oxide semiconductor layer; and an oxide insulating layer in contact with the oxide semiconductor layer. The carrier concentration of the oxide semiconductor layer is less than $1\times10^{12}/cm^3$. The length of a channel formed in the oxide semiconductor layer is 0.2 μm to 3.0 μm inclusive. The thickness of the oxide semiconductor layer is 15 nm to 100 nm inclusive. The thickness of the gate insulating layer is 10 nm to 20 nm inclusive.

An object of an embodiment of the present invention is to achieve the following, with the above structure. The maximum of the amount of change in threshold voltage (ΔVth) is less than 0.5 V, preferably 0.25 V or less, more preferably 0.1 V or less. To suppress ΔVth to 0.25 V or less, it is preferable to set the thicknesses of the gate insulating layer and the oxide semiconductor layer to 10 nm to 20 nm inclusive and 15 nm to 50 nm inclusive, respectively, or 20 nm to 50 nm inclusive and 15 nm or less, respectively. To suppress ΔVth to 0.1 V or less, it is preferable to set the thicknesses of the gate insulating layer and the oxide semiconductor layer to 10 nm to 20 nm inclusive and 15 nm or less, respectively.

In the above structure, the gate electrode layer of the insulated gate transistor can be formed using a film containing a metal element selected from aluminum, copper, molybdenum, titanium, chromium, tantalum, tungsten, neodymium, and scandium as its main component; an alloy film; or a stack of two or more of these films.

The source electrode layer and the drain electrode layer may be formed using any of the metal elements that can be used for the gate electrode layer, or may be formed to have a structure in which a high-melting-point metal layer of chromium, tantalum, titanium, molybdenum, tungsten or the like is formed above and/or below a metal layer of aluminum, copper, or the like. In the case of using aluminum, an aluminum material to which an element preventing generation of hillocks and whiskers in an aluminum film, such as silicon, titanium, tantalum, tungsten, molybdenum, chromium, neodymium, or yttrium, is added may be used instead of pure aluminum.

As the gate insulating layer, a single-layer film or a laminate film of any of silicon oxide, silicon oxynitride, silicon nitride oxide, silicon nitride, aluminum oxide, hafnium oxide, tantalum oxide, and the like can be used.

In the above structure, the insulated gate transistor includes the oxide insulating layer over the oxide semiconductor layer, and the oxide insulating layer may be formed using an inorganic insulating film typified by a silicon oxide film, a silicon nitride oxide film, an aluminum oxide film, or an aluminum oxynitride film.

Note that as the oxide semiconductor layer, a thin film expressed by $InMO_3(ZnO)_m$ (m>0) can be used. Here, M represents one or more metal elements selected from Ga, Al, Mn, and Co. For example, M can be Ga, Ga and Al, Ga and Mn, Ga and Co, or the like.

By forming an insulated gate transistor with the above structure, even in the case where an intrinsic or substantially intrinsic semiconductor is used for a channel formation region, a short-channel effect can be suppressed to the utmost, and in the above range of the channel lengths, the maximum of the amount of change in threshold voltage can be suppressed to less than 0.5 V.

Note that in this specification, a semiconductor device means a general device which can function by utilizing semiconductor characteristics, and an electrooptic device, a semiconductor circuit, and an electronic device are all semiconductor devices.

According to an embodiment of the present invention, even in an insulated gate transistor including an intrinsic or substantially intrinsic highly-purified oxide semiconductor layer, which has a structure where the channel length is short, a short-channel effect can be suppressed by appropriately setting the thicknesses of the oxide semiconductor layer and a gate insulating layer.

BRIEF DESCRIPTION OF DRAWINGS

FIGS. 7A and 7B are energy band diagrams (schematic diagrams) corresponding to a cross section taken along A-A' in FIG. 6.

FIGS. 8A and 8B are energy band diagrams (schematic diagrams) corresponding to a cross section taken along B-B' in FIG. 6; FIG. 8A illustrates a state in which a positive potential ($V_G>0$) is supplied to a gate (G1) and FIG. 8B illustrates a state in which a negative potential ($V_G<0$) is supplied to the gate (G1).

BEST MODE FOR CARRYING OUT THE INVENTION

Figure 1:
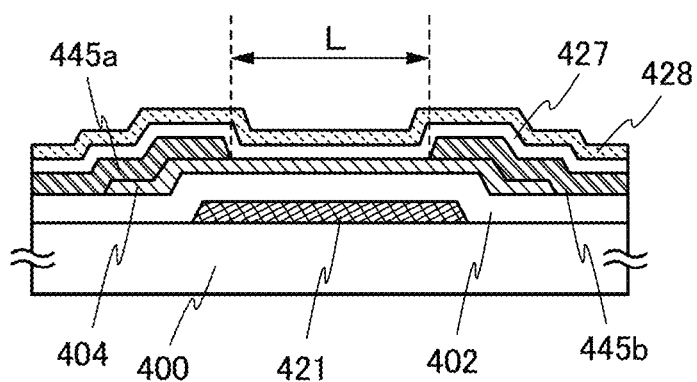
FIG. 1 is a cross-sectional view illustrating a transistor according to an embodiment of the present invention.

Embodiments and an example will be described with reference to drawings. Note that the present invention is not limited to the following description, and it will be easily understood by those skilled in the art that the modes and details of the present invention can be modified in various ways without departing from the spirit and scope of the present invention. Therefore, the present invention should not be construed as being limited to the following description of the embodiments and the example. Note that in structures of the present invention described below, the same portions or portions having similar functions are denoted by the same reference numerals in different drawings, and description thereof is omitted.

Embodiment 1

In this embodiment, described will be a structure of an insulated gate transistor according to an embodiment of the present invention and a manufacturing method of the insulated gate transistor.

In this embodiment, an inverted-staggered insulated gate transistor is taken as an example and FIG. 1 illustrates a structure thereof. Note that the structure is not limited to an inverted-staggered structure, and any of the other bottom-contact structures, top-gate structures, and the like may be adopted.

The insulated gate transistor illustrated in FIG. 1 includes, over a substrate 400, a gate electrode layer 421, a gate insulating layer 402, an oxide semiconductor layer 404, a source electrode layer 445a, a drain electrode layer 445b, an oxide insulating layer 427, and an insulating layer 428 serving as a protective film.

In addition, "L" in FIG. 1 indicates the channel length of a channel region formed in the oxide semiconductor layer 404 and is defined by the distance between the source electrode layer 445a and the drain electrode layer 445b. In general, when the distance is short, the proportion of depletion layers of a source region and a drain region, which extend to the channel region, is likely to increase, so that control of a current with a gate voltage is difficult. In other words, a so-called short-channel effect is likely to occur. Particularly in the insulated gate transistor which is an embodiment of the present invention, since an oxide semiconductor layer that is an intrinsic or substantially intrinsic semiconductor with a significantly low carrier concentration is used for a channel formation region, a depletion layer is likely to extend and thus a short-channel effect is likely to be caused.

When a short-channel effect occurs, for example, the threshold voltage changes and further, the subthreshold swing and the off current increase and the withstand voltage between a source and a drain decreases; thus, properties of a transistor get considerably worse. To suppress a short-channel effect, it is effective to reduce the thickness of an oxide semiconductor layer which is a channel formation layer so that extension of a depletion layer due to a drain electrical field can be suppressed and to reduce the thickness of a gate insulating layer to increase a gate electrical field so that the influence of the drain electrical field is relatively decreased.

Therefore, in the case where the oxide semiconductor layer according to an embodiment of the present invention, which is an intrinsic or substantially intrinsic semiconductor with a significantly low carrier concentration, is used for a channel formation region, the oxide semiconductor layer and a gate insulating layer have preferred ranges of thicknesses with respect to channel lengths in a certain range, which allow a short-channel effect to be suppressed. When an insulated gate transistor with a channel length of 0.2 µm to 3.0 µm inclusive includes an oxide semiconductor layer and a gate insulating layer which have the following thicknesses, the maximum of the amount of change in threshold voltage can be suppressed to less than 0.5 V.

The gate electrode layer 421 can be formed to have a single-layer structure or a layered structure using a metal material such as aluminum, copper, molybdenum, titanium, chromium, tantalum, tungsten, neodymium, or scandium; an alloy material containing any of these metal materials as its main component; or a nitride containing any of these metal materials. It is preferable that the gate electrode layer be formed with the use of a low-resistance metal material such as aluminum or copper, which is effective; however, the low-resistance metal material is preferably used in combination with a high-melting-point metal material because it has disadvantages such as low heat resistance and a tendency to be corroded. As the high-melting-point metal material, molybdenum, titanium, chromium, tantalum, tungsten, neodymium, scandium, or the like can be used.

The source electrode layer 445a and the drain electrode layer 445b (including a wiring layer formed in the same layer as the source electrode layer 445a and the drain electrode layer 445b) may be formed using any of the metal elements that can be used for the gate electrode layer, or may be formed to have a structure in which a high-melting-point metal layer of chromium, tantalum, titanium, molybdenum, tungsten or the like is formed above and/or below a metal layer of aluminum, copper, or the like. Still alternatively, when an aluminum material to which an element preventing generation of hillocks and whiskers in an aluminum film, such as silicon, titanium, tantalum, tungsten, molybdenum, chromium, neodymium, or yttrium, is added is used, heat resistance can be increased.

Alternatively, the source electrode layer 445a and the drain electrode layer 445b (including a wiring layer formed in the same layer as the source electrode layer 445a and the drain electrode layer 445b) may be formed using a conductive metal oxide. As the conductive metal oxide, indium oxide ($In_2O_3$), tin oxide ($SnO_2$), zinc oxide (ZnO), an alloy of indium oxide and tin oxide ($In_2O_3$—$SnO_2$, abbreviated to ITO), an alloy of indium oxide and zinc oxide ($In_2O_3$—ZnO), or any of the metal oxide materials containing silicon or silicon oxide can be used.

As the gate insulating layer 402, a single-layer film or a laminate film of any of silicon oxide, silicon oxynitride, silicon nitride oxide, silicon nitride, aluminum oxide, hafnium oxide, tantalum oxide, and the like formed by a CVD method, a sputtering method, or the like can be used. The thickness of the gate insulating layer 402 is 10 nm to 20 nm inclusive or 20 nm to 50 nm inclusive and is selectively combined with an example of the thickness of the oxide semiconductor layer, which will be described below.

As a material used for the oxide semiconductor layer 404, a four-component metal oxide material such as an In—Sn—Ga—Zn—O-based material; a three-component metal oxide material such as an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material; or a two-component metal oxide material such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; an In—O-based material, a Sn—O-based material, or a Zn—O-based material can be used. In addition, the above materials may contain $SiO_2$. Here, for example, an In—Ga—Zn—O-based material means oxide containing indium (In), gallium (Ga), and zinc (Zn), and there is no particular limitation on the composition ratio. Further, the In—Ga—Zn—O-based material may contain an element other than In, Ga, and Zn.

The oxide semiconductor layer 404 is formed by a sputtering method. When the thickness of the gate insulating layer 402 is 10 nm to 20 nm inclusive, the thickness of the oxide semiconductor layer 404 is preferably 15 nm to 100 nm inclusive, and when the thickness of the gate insulating layer 402 is 20 nm to 50 nm inclusive, the thickness of the oxide semiconductor layer 404 is preferably 15 nm to 30 nm inclusive. With such a combination, a short-channel effect can be suppressed to the utmost.

After being formed, the oxide semiconductor layer 404 is subjected to dehydration or dehydrogenation treatment with an electric furnace, an RTA (rapid thermal annealing) apparatus, or the like. The dehydration or dehydrogenation treatment is performed in an inert gas atmosphere at 400° C. to 750° C. inclusive. Note that in the case where glass or the like is used as a substrate, it is necessary to perform the dehydration or dehydrogenation treatment at a temperature less than or equal to the strain point of the substrate. For example, heating may be performed using an electric furnace at 450° C. for an hour. With an RTA apparatus, dehydration or dehydrogenation can be performed in a short time; therefore, treatment can be performed even at a temperature higher than the strain point of a glass substrate.

The oxide insulating layer 427 functioning as a channel protective layer is provided over the oxide semiconductor layer 404, the source electrode layer 445a, and the drain electrode layer 445b. The oxide insulating layer 427 is formed using an inorganic insulating film typified by a silicon oxide film, a silicon oxynitride film, a silicon nitride oxide film, an aluminum oxide film, or an aluminum oxynitride film.

Further, the insulating layer 428 is preferably provided as a protective film. As the insulating layer 428, a silicon nitride film, a silicon nitride oxide film, or an aluminum nitride film is preferably used.

Although not illustrated, a conductive film may be provided over the oxide insulating layer 427 or the insulating layer 428 to overlap with a channel formation region so that a back gate electrode layer is formed. It is effective to set the potential of the back gate electrode layer to a specific potential (e.g., the ground potential) in terms of suppression of change in threshold voltage.

Next, a method for manufacturing the insulated gate transistor including an oxide semiconductor layer in FIG. 1 will be described with reference to FIGS. 2A to 2E.

First, a conductive film is formed over the substrate 400 having an insulating surface. Then, a resist mask is formed by a first photolithography process and the conductive film is selectively etched, so that the gate electrode layer 421 is formed.

Note that the resist mask may be formed by an ink-jet method. Formation of the resist mask by an inkjet method needs no photomask; thus, manufacturing costs can be reduced.

The conductive film which forms the gate electrode layer 421 is formed using an element selected from aluminum, copper, molybdenum, titanium, chromium, tantalum, tungsten, neodymium, and scandium; a metal material including any of the above elements as its main component; an alloy film containing a combination of any of these elements or any of the above metal materials; a stack of any of these elements, any of the above metal materials, and any of the alloy films; or the like.

When the temperature of the heat treatment performed later is high, a glass substrate having a strain point of 730° C. or higher is preferably used as the substrate 400. As a material of the glass substrate, a glass material such as aluminosilicate glass, aluminoborosilicate glass, or barium borosilicate glass can be used, for example.

Note that, instead of the glass substrate described above, a substrate formed using an insulator, such as a ceramic substrate, a quartz substrate, or a sapphire substrate, may be used as the substrate 400. Alternatively, a crystallized glass substrate or the like may be used.

Although not illustrated, an insulating layer serving as a base film may be provided between the substrate 400 and the gate electrode layer 421. The base film has a function of preventing diffusion of an impurity element from the substrate 400, and can be formed with a single-layer structure or a layered structure using one or more of a silicon nitride film, a silicon oxide film, a silicon nitride oxide film, and a silicon oxynitride film.

As an example of a method for forming the insulating layer, an example of forming a silicon oxide layer by a sputtering method will be described. For example, a silicon oxide film is formed with an RF sputtering method under the following condition: quartz (preferably, synthetic quartz) is used as a target; the substrate temperature is 108° C.; the distance between the substrate and the target (the T-S distance) is 60 mm; the pressure is 0.4 Pa; the high frequency power is 1.5 kW; and the atmosphere is an atmosphere containing oxygen and argon (the flow ratio of oxygen to argon is 1:1 (each flow rate is 25 sccm). The thickness of the silicon oxide film is 100 nm. A practitioner may change these conditions appropriately. Note that instead of quartz (preferably, synthetic quartz), a silicon target may be used as a target used when the silicon oxide film is formed. As a sputtering gas, oxygen or a mixed gas of oxygen and argon is used, and an RF sputtering method is employed.

In that case, the insulating layer is preferably formed removing moisture remaining in the treatment chamber. This is for preventing hydrogen, a hydroxyl group, and moisture from being contained in the insulating layer.

In order to remove moisture remaining in the treatment chamber, an entrapment vacuum pump is preferably used. For example, a cryopump, an ion pump, or a titanium sublimation pump is preferably used. Further, an evacuation unit may be a turbo molecular pump provided with a cold trap. In the deposition chamber which is evacuated with the cryopump, a hydrogen atom, a compound containing a hydrogen atom, such as water ($H_2O$), and the like are removed, whereby the concentration of an impurity (particularly hydrogen) in the insulating layer formed in the deposition chamber can be reduced.

It is preferable to use a high-purity gas from which an impurity such as hydrogen, water, a hydroxyl group, or hydride is removed to a concentration of several ppm or several ppb, as a sputtering gas used when the insulating layer is formed.

Examples of a sputtering method include an RF sputtering method described above in which a high-frequency power source is used as a sputtering power source, a DC sputtering method, and a pulsed DC sputtering method in which a bias is applied in a pulsed manner. An RF sputtering method is mainly used in the case where an insulating film is formed, and a DC sputtering method is mainly used in the case where a metal conductive film is formed.

In addition, there is also a multi-source sputtering apparatus in which a plurality of targets of different materials can be set. With the multi-source sputtering apparatus, films of different materials can be formed to be stacked in the same chamber, or plural kinds of materials can be sputtered for film formation at the same time in the same chamber.

In addition, there are a sputtering apparatus provided with a magnet system inside the chamber, which is for a magnetron sputtering method, and a sputtering apparatus which is used for an ECR sputtering method in which plasma produced with the use of microwaves is used without using glow discharge.

Furthermore, as a deposition method using a sputtering method, there are also a reactive sputtering method in which a target substance and a sputtering gas component are chemically reacted with each other during deposition to form a thin compound film thereof, and a bias sputtering method in which voltage is also applied to a substrate during deposition. A practitioner may select any of these sputtering methods as appropriate.

Further, the insulating layer may have a layered structure in which for example, a nitride insulating layer such as a silicon nitride layer, a silicon nitride oxide layer, an aluminum nitride layer, or an aluminum nitride oxide layer and the above oxide insulating layer are stacked in this order from the substrate side.

For example, a sputtering gas from which hydrogen and moisture are removed and which contains high-purity nitrogen is introduced and a silicon target is used, whereby a silicon nitride layer is formed between a silicon oxide layer and a substrate. In this case, the silicon nitride layer is preferably formed removing moisture remaining in a treatment chamber, similarly to the silicon oxide layer.

In the case of forming the silicon nitride layer, a substrate may be heated in film formation.

In the case where the stack of the silicon nitride layer and the silicon oxide layer is thus provided as the insulating layer, the silicon nitride layer and the silicon oxide layer can be formed with the use of a common silicon target in the same treatment chamber. After an sputtering gas containing nitrogen is introduced first, a silicon nitride layer is formed using a silicon target mounted in the treatment chamber, and then, the sputtering gas is switched to an sputtering gas containing oxygen and the same silicon target is used to form a silicon oxide layer. Consequently, the silicon nitride layer and the silicon oxide layer can be formed successively without being exposed to the air; therefore, impurities such as hydrogen and moisture can be prevented from adsorbing onto a surface of the silicon nitride layer.

Next, a gate insulating layer 402 is formed over the gate electrode layer 421.

Here, an oxide semiconductor layer to be formed later is an oxide semiconductor that becomes intrinsic or substantially intrinsic by removal of impurities (a highly-purified oxide semiconductor) and is quite susceptible to the interface level and the interface electric charge; therefore, the interface with the gate insulating layer is important. For that reason, the gate insulating layer that is to be in contact with a highly-purified oxide semiconductor needs to have high quality.

For example, a high-density plasma CVD method using microwaves (2.45 GHz) is preferably employed because an insulating film which is dense and has high withstand voltage and high quality can be formed. When a highly-purified oxide semiconductor and a high-quality gate insulating layer are in close contact with each other, the interface level can be reduced and interface characteristics can be favorable. It is needless to say that another film formation method such as a sputtering method or a plasma CVD method can be employed as long as a high-quality insulating layer can be formed as a gate insulating layer. Moreover, it is possible to form an insulating layer whose quality and characteristics of an interface with an oxide semiconductor are improved through heat treatment performed after the formation of the insulating layer. In any case, an insulating layer that has favorable quality as the gate insulating layer and can reduce interface state density with an oxide semiconductor to form a favorable interface is formed.

For example, in a gate bias-temperature stress test (BT test) at 85° C. with $2 \times 10^6$ V/cm for 12 hours, if an impurity is added to an oxide semiconductor, a bond between the impurity and a main component of the oxide semiconductor is broken by a high electrical field (B: bias) and high temperature (T: temperature), and a dangling bond generated causes drift of the threshold voltage (Vth). In contrast, according to an embodiment of the present invention, impurities of an oxide semiconductor, particularly hydrogen, water, and the like, are reduced to a minimum and interface characteristics between the oxide semiconductor and the gate insulating layer are made favorable as described above, whereby an insulated gate transistor that is stable with respect to the BT test can be obtained.

In this embodiment, the gate insulating layer 402 is formed using a high-density plasma CVD apparatus where microwaves (2.45 GHz) are used. Here, a high-density plasma CVD apparatus refers to an apparatus which can realize a plasma density higher than or equal to $1 \times 10^{11}/cm^3$. For example, plasma is generated by applying a microwave power of 3 kW to 6 kW inclusive.

A monosilane gas ($SiH_4$), nitrous oxide ($N_2O$), and a rare gas are introduced into a chamber as a source gas to generate high-density plasma under a pressure of 10 Pa to 30 Pa, and the insulating layer is formed over the substrate. Subsequently, plasma treatment may be performed on a surface of the insulating layer by introducing nitrous oxide ($N_2O$) and a rare gas without exposure to the air after the supply of a monosilane gas is stopped. At least after the formation of the insulating layer, the plasma treatment is performed on the surface of the insulating layer by introducing nitrous oxide ($N_2O$) and a rare gas. The insulating layer formed through the above process procedure is an insulating layer whose reliability can be ensured even if it has a small thickness of less than 100 nm, for example.

In forming the gate insulating layer 402, the flow ratio of a monosilane gas ($SiH_4$) to nitrous oxide ($N_2O$) which are introduced into the chamber is in the range of 1:10 to 1:200. In addition, as a rare gas which is introduced into the chamber, helium, argon, krypton, xenon, or the like can be used. In particular, argon, which is inexpensive, is preferably used.

Further, the insulating layer formed using the high-density plasma CVD apparatus has excellent step coverage and excellent thickness controllability.

The quality of the insulating layer formed using the high-density plasma CVD apparatus is significantly different from that of an insulating layer obtained by the use of a conventional parallel plate plasma CVD apparatus. For example, the etching rate of the insulating layer formed using the high-density plasma CVD apparatus is lower than that of the insulating layer formed using the parallel plate plasma CVD apparatus by 10% or more or 20% or more when they are compared with each other using the same etchant. That is, the insulating layer formed using the high-density plasma CVD apparatus can be said to be dense.

In this embodiment, a silicon oxynitride film (also referred to as $SiO_xN_y$, where $x>y>0$) with a thickness of 10 nm to 50 nm inclusive formed using the high-density plasma CVD apparatus is used as the gate insulating layer 402.

Alternatively, the gate insulating layer 402 may be formed to have a single-layer or layered structure using any of a silicon oxide layer, a silicon nitride layer, a silicon oxynitride layer, a silicon nitride oxide layer, an aluminum oxide layer, hafnium oxide layer, and tantalum oxide layer by a plasma CVD method, a sputtering method, or the like. Note that the gate insulating layer 402 is preferably formed by a sputtering method so that it contains hydrogen as little as possible. In the case of forming a silicon oxide film by a sputtering method, a silicon target or a quartz target is used as a target and oxygen or a mixed gas of oxygen and argon is used as a sputtering gas. Further, the gate insulating layer 402 is preferably formed while removing moisture remaining in the treatment chamber by a method similar to the aforementioned method for forming an insulating layer (base film).

Still alternatively, the gate insulating layer 402 may have a structure in which a silicon oxide layer and a silicon nitride layer are stacked. For example, a gate insulating layer having a total thickness of 10 nm to 50 nm inclusive may be formed in such a manner that a silicon oxide layer ($SiO_x$ ($x>0$)) as a first gate insulating layer and then a silicon nitride layer ($SiN_y$ ($y>0$)) is stacked as a second gate insulating layer over the first gate insulating layer.

Figure 2A:
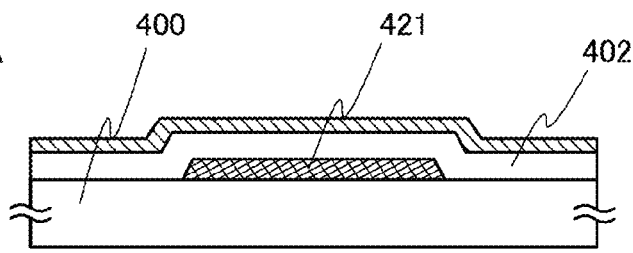
FIGS. 2A to 2E are cross-sectional views illustrating a manufacturing process of a transistor according to an embodiment of the present invention.
Figure 2B:
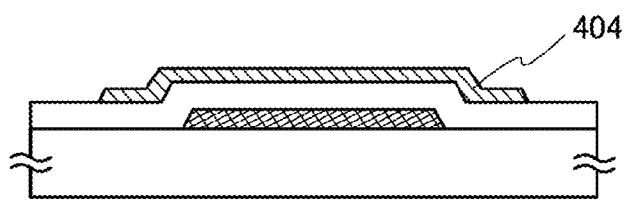
Figure 2C:
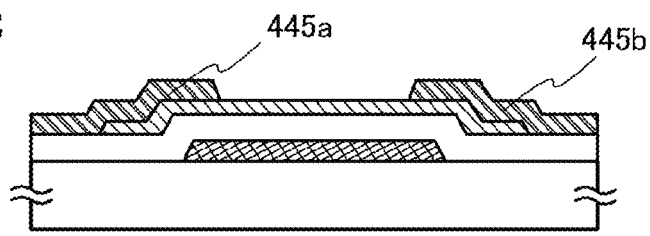

Next, over the gate insulating layer 402, an oxide semiconductor film is formed to a thickness of 10 nm to 100 nm inclusive (see FIG. 2A).

Here, as described above, the combination of the thicknesses of the gate insulating layer and the oxide semiconductor film is set so that the maximum of the amount of change in threshold voltage can be suppressed to less than 0.5 V when the channel length L is within the range of 0.2 μm to 3.0 μm inclusive.

As the oxide semiconductor film, a thin film expressed by $InMO_3(ZnO)_m$ ($m>0$) can be used. Here, M represents one or more metal elements selected from Ga, Al, Mn, and Co. For example, M can be Ga, Ga and Al, Ga and Mn, Ga and Co, or the like.

In this embodiment, the oxide semiconductor film is formed by a sputtering method with the use of an In—Ga—Zn—O-based oxide semiconductor target. As the sputtering gas, a rare gas (typically, argon), oxygen, or a mixed gas of a rare gas (typically, argon) and oxygen can be used.

It is preferable to use a high-purity gas from which an impurity such as hydrogen, water, a hydroxyl group, or hydride is removed to a concentration of several ppm or several ppb, as the sputtering gas.

As the film formation target used for a sputtering method, metal oxide with the following composition ratio is used: the composition ratio of $In_2O_3:Ga_2O_3:ZnO$ is 1:1:1 [molar ratio]. Alternatively, metal oxide with the following composition ratio may be used: the composition ratio of $In_2O_3:Ga_2O_3:ZnO$ is 1:1:2 [molar ratio].

The fill rate of the film formation target is 90% to 100% inclusive, preferably, 95% to 100% inclusive. With the use of the film formation target with high fill rate, a dense oxide semiconductor film can be formed.

The substrate is held in a treatment chamber kept under reduced pressure, a sputtering gas from which hydrogen and moisture are removed is introduced into the treatment chamber from which remaining moisture is being removed, and the oxide semiconductor film is formed over the insulating layer with the use of the metal oxide as the target. To remove moisture remaining in the treatment chamber, an entrapment vacuum pump is preferably used. For example, a cryopump, an ion pump, or a titanium sublimation pump is preferably used. Further, an evacuation unit may be a turbo molecular pump provided with a cold trap. In the deposition chamber which is evacuated with the cryopump, a hydrogen atom, a compound containing a hydrogen atom, such as water ($H_2O$), (more preferably, also a compound containing a carbon atom), and the like are removed, whereby the concentration of an impurity in the oxide semiconductor film formed in the deposition chamber can be reduced. The substrate may be heated when the oxide semiconductor film is formed.

An example of the deposition condition is as follows: the substrate temperature is room temperature, the distance between the substrate and the target is 110 mm, the pressure is 0.4 Pa, the DC power is 0.5 kW, and the atmosphere is an atmosphere containing oxygen and argon (the flow ratio of oxygen is 15 sccm:the flow rate of argon is 30 sccm). It is preferable that a pulsed DC power source be used because particles (also referred to as powder substances or dust) generated in film formation can be reduced and the film thickness can be uniform.

Note that before the oxide semiconductor film is formed by a sputtering method, dust attached to a surface on which the oxide semiconductor film is to be formed is preferably removed by reverse sputtering in which an argon gas is introduced and plasma is generated. Here, the reverse sputtering is a method by which ions collide with a surface to be processed so that the surface is modified, in contrast to normal sputtering by which ions collide with a sputtering target. Note that a nitrogen atmosphere, a helium atmosphere, an oxygen atmosphere, or the like may be used instead of an argon atmosphere.

Before formation of the oxide semiconductor film, heat treatment (at higher than or equal to 400° C. and lower than the strain point of the substrate) may be performed in an inert gas atmosphere (e.g., nitrogen, helium, neon, or argon) so that impurities such as hydrogen and water, which are contained in the gate insulating layer, are removed.

Next, the oxide semiconductor film is processed into an island-shaped oxide semiconductor layer through a second photolithography process. That is, a resist is applied over the oxide semiconductor film and processed by a known photolithography method to form a resist mask. The resist mask may be formed by an ink-jet method. When the resist mask is formed by an ink-jet method, manufacturing costs can be reduced (see FIG. 2B).

Then, the oxide semiconductor layer 404 is subjected to first heat treatment. The temperature of the first heat treatment is higher than or equal to 400° C. and lower than or equal to 750° C., preferably higher than or equal to 400° C. and lower than the strain point of the substrate. Here, the substrate is introduced into an electric furnace which is one of heat treatment apparatuses, heat treatment is performed on the oxide semiconductor layer in a nitrogen atmosphere at 450° X φpρ ονε ηουρ. Through the first heat treatment, dehydration or dehydrogenation of the oxide semiconductor layer 404 can be conducted. The atmosphere may be switched to oxygen when the temperature is lowered from the heat treatment temperature. By switching the atmosphere to oxygen when the temperature is lowered, oxygen is supplied to an oxygen vacancy portion in the oxide semiconductor. When oxygen vacancy which generates carriers is eliminated, carriers are significantly reduced and thus, an oxide semiconductor having very low carrier concentration that is a feature of the present invention can be obtained.

Note that in this specification, heat treatment under an atmosphere of an inert gas such as nitrogen or a rare gas is referred to as heat treatment for dehydration or dehydrogenation. In this specification, "dehydrogenation" does not indicate elimination of only $H_2$ by heat treatment. For convenience, elimination of H, OH, and the like is also referred to as "dehydration or dehydrogenation".

The apparatus for the heat treatment is not limited to the electric furnace and may be the one provided with a device for heating an object to be processed, using heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed due to heat treatment, such as nitrogen or a rare gas such as argon is used.

For example, as the first heat treatment, GRTA may be performed as follows. The substrate is transferred and put in an inert gas which has been heated to a high temperature of 650° C. to 700° C. inclusive, heated for several minutes, and transferred and taken out of the inert gas which has been heated to a high temperature. GRTA enables high-temperature heat treatment in a short time.

Note that in the first heat treatment, it is preferable that water, hydrogen, and the like be not included in the treatment atmosphere, for example, nitrogen or a rare gas such as helium, neon, or argon. Therefore, it is preferable that nitrogen or a rare gas such as helium, neon, or argon introduced into an apparatus for the heat treatment have a purity of 6N (99.9999%) or more, preferably, 7N (99.99999%) or more (that is, an impurity concentration is set to 1 ppm or lower, preferably, 0.1 ppm or lower). When using oxygen, the purity of oxygen is preferably at a similar level.

The oxide semiconductor layer 404 might be crystallized to be a microcrystalline film or a polycrystalline film depending on a condition of the first heat treatment or a material of the oxide semiconductor layer. For example, the oxide semiconductor layer may be crystallized to become a microcrystalline oxide semiconductor layer having a degree of crystallization of 90% or more, or 80% or more. Further, depending on the condition of the first heat treatment and the material of the oxide semiconductor layer, the oxide semiconductor layer may become an amorphous oxide semiconductor layer containing no crystalline component. The oxide semiconductor layer might become an oxide semiconductor layer in which a microcrystalline portion (with a grain diameter greater than or equal to 1 nm and less than or equal to 20 nm, typically greater than or equal to 2 nm and less than or equal to 4 nm) is mixed into an amorphous oxide semiconductor layer.

Alternatively, the first heat treatment of the oxide semiconductor layer may be performed on the oxide semiconductor film which has not yet been processed into the island-shaped oxide semiconductor layer. In that case, after the first heat treatment, the substrate is taken out of the heating apparatus and a photolithography process is performed. Note that it is desirable that water be not attached to the oxide semiconductor layer in a later step.

Note that the heat treatment for dehydration or dehydrogenation on the oxide semiconductor layer may be performed at any of the following timings: after the oxide semiconductor layer is formed; after a source electrode layer and a drain electrode layer are formed over the oxide semiconductor layer; and after an oxide insulating layer is formed over the source electrode layer and the drain electrode layer.

In the oxide semiconductor layer which is sufficiently dehydrated or dehydrogenated under the above conditions, at least a peak at around 250° C. to 300° C. of two peaks in spectra which show discharge of moisture is not detected by thermal desorption spectroscopy (TDS) even when the temperature of the dehydrated or dehydrogenated oxide semiconductor layer is increased to 450° C.

After the semiconductor layer 404 is formed to have an island shape, a conductive film is formed over the gate insulating layer 402 and the oxide semiconductor layer 404.

The conductive film is formed using an element selected from aluminum, copper, molybdenum, titanium, chromium, tantalum, tungsten, neodymium, and scandium; an alloy including any of the above elements as its main component; an alloy containing a combination of any of the above elements; or the like. The conductive film may have a structure in which a high-melting-point metal layer of chromium, tantalum, titanium, molybdenum, tungsten, or the like is formed above and/or below a metal layer of aluminum, copper, or the like. In the case of using aluminum, an aluminum material to which an element preventing generation of hillocks and whiskers in an aluminum film, such as silicon, titanium, tantalum, tungsten, molybdenum, chromium, neodymium, or yttrium, is added is used, whereby heat resistance can be increased.

Alternatively, the conductive film may be formed using conductive metal oxide. As the conductive metal oxide, indium oxide ($In_2O_3$), tin oxide ($SnO_2$), zinc oxide (ZnO), an alloy of indium oxide and tin oxide ($In_2O_3$—$SnO_2$, abbreviated to ITO), an alloy of indium oxide and zinc oxide ($In_2O_3$—ZnO), or any of the metal oxide materials containing silicon or silicon oxide can be used.

Next, a third photolithography process is performed. A resist mask is formed and the conductive film is selectively etched, so that the source electrode layer 445a and the drain electrode layer 445b are formed. After that, the resist mask is removed (see FIG. 2C).

The resist mask used for forming the source electrode layer 445a and the drain electrode layer 445b may be formed by an ink-jet method. When the resist mask is formed with an ink jet method, a photomask is not used; therefore, manufacturing costs can be reduced.

Figure 2D:
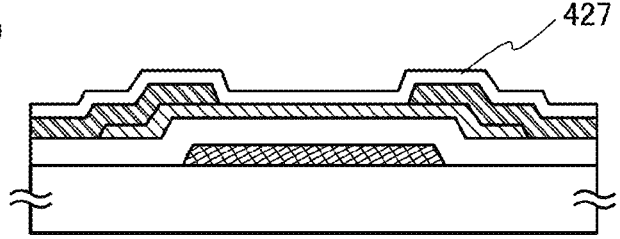

Then, the oxide insulating layer 427 is formed over the oxide semiconductor layer 404, the source electrode layer 445a, and the drain electrode layer 445b (see FIG. 2D). The oxide insulating layer 427 is formed using a silicon oxide film, a silicon nitride oxide film, an aluminum oxide film, an aluminum oxynitride film, or the like. In this embodiment, the oxide insulating layer 427 is formed of a silicon oxide film by a sputtering method.

The oxide insulating layer 427, which has a thickness of 1 nm or more, can be formed as appropriate using a method with which impurities such as water and hydrogen are not mixed into the oxide insulating layer 427. In this embodiment, a silicon oxide film is formed for the oxide insulating layer 427 with a sputtering method. The substrate temperature in film formation may be from a room temperature to 300° C. and in this embodiment, is 100° C. In order to prevent entry of an impurity such as water or hydrogen in the film formation, it is preferable to perform pre-baking under reduced pressure at a temperature from 150° C. to 350° C. for from two to ten minutes so that moisture and the like attached to a surface is volatilized, before the film formation, to form an oxide insulating layer 427 without exposure to the air. The silicon oxide film can be formed with a sputtering method in a rare gas (typically argon) atmosphere, an oxygen atmosphere, or a mixed atmosphere containing a rare gas (typically argon) and oxygen. Further, a silicon oxide target or a silicon target can be used as a target. For example, with the use of a silicon target, a silicon oxide film can be formed with a sputtering method in an atmosphere of oxygen and a rare gas. The oxide insulating layer which is formed in contact with the oxide semiconductor layer is formed using an inorganic insulating film that does not contain impurities such as moisture, a hydrogen ion, and $OH^-$ and blocks entry of such impurities from the outside.

Next, second heat treatment is performed in an inert-gas atmosphere such as a nitrogen atmosphere (preferably at a temperature from 200° C. to 400° C., e.g., from 250° C. to 350° C.). For example, the second heat treatment is performed in a nitrogen atmosphere at 250° C. for one hour. Alternatively, RTA treatment may be performed at high temperature for a short time. The second heat treatment is performed in a state where the oxide insulating layer 427 is in contact with part of the oxide semiconductor layer 404. Note that through the second heat treatment, the oxide semiconductor layer 404 which comes to have lower resistance through the first heat treatment (dehydration or dehydrogenation) is in an oxygen excess state. Thus, the oxide semiconductor layer 404 can have higher resistance (be i-type).

In this embodiment, the second heat treatment is performed after formation of the silicon oxide film; however, the timing of the heat treatment is not limited to the timing immediately after formation of the silicon oxide film as long as it is after formation of the silicon oxide film. Note that the timing of the heat treatment is not limited to that timing and may be performed plural times, for example, before and after a photolithography process or a film formation step.

Further, heat treatment may be performed at 100° C. to 200° C. inclusive for one hour to 30 hours inclusive in the air. This heat treatment may be performed at a fixed heating temperature. Alternatively, the following change in the heating temperature may be conducted plural times repeatedly: the heating temperature is increased from a room temperature to a temperature of 100° C. to 200° C. inclusive and then decreased to a room temperature. Further, this heat treatment may be performed under a reduced pressure before formation of the oxide insulating layer. Under a reduced pressure, the heating time can be shortened.

Figure 2E:
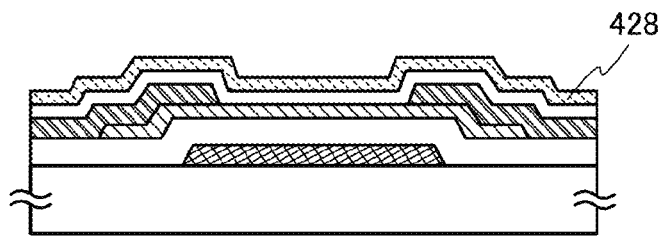

Next, the insulating layer 428 that is a protective insulating layer is formed over the oxide insulating layer 427 (see FIG. 2E). As the insulating layer 428, a silicon nitride film, a silicon nitride oxide film, an aluminum nitride film, or the like is used. In this embodiment, the insulating layer 428 is formed of a silicon nitride film by a sputtering method.

When the oxide semiconductor film is formed, residual moisture in an atmosphere is removed and moisture in the film is removed by heat treatment in the above-described manner; thus, the concentration of hydrogen and hydride in the oxide semiconductor film can be reduced. In addition, annealing treatment in an atmosphere containing oxygen or annealing treatment while the oxide semiconductor film is in contact with the oxide insulating layer is performed, whereby oxygen can be supplied to oxygen vacancy. Thus, an insulated gate transistor including an intrinsic or substantially intrinsic oxide semiconductor with a carrier concentration of less than $1 \times 10^{12}/cm^3$, preferably less than $1 \times 10^{11}/cm^3$, more preferably with an intrinsic carrier concentration of silicon of $1.45 \times 10^{10}/cm^3$ or less can be provided.

Further, by favorably controlling the channel length of an insulated gate transistor, and the thicknesses of an oxide semiconductor layer and a gate insulating layer, a short-channel effect can be suppressed to the utmost in such an intrinsic or substantially intrinsic oxide semiconductor.

Note that the structure described in this embodiment can be combined with any of the structures described in the other embodiments and the example as appropriate.

Embodiment 2

According to an embodiment of the present invention, impurities to be donors (or acceptors) of carriers in an oxide semiconductor are reduced to a significantly low level, whereby the semiconductor is made to be intrinsic or substantially intrinsic, and the oxide semiconductor is used for an insulated gate transistor. In this embodiment, the fact that the insulated gate transistor includes an intrinsic or substantially intrinsic semiconductor will be described with the use of measurement values of off currents obtained with an element for evaluation (also referred to as TEG) and band diagrams.

Figure 3:
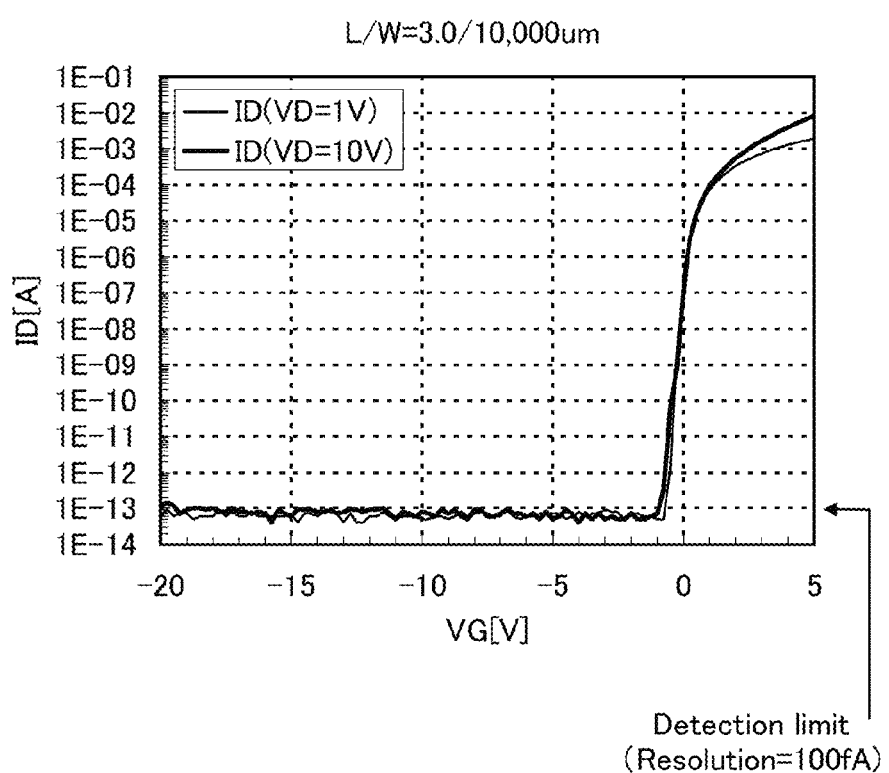
FIG. 3 shows VG-ID characteristics of an insulated gate transistor including an oxide semiconductor.
Figure 4A:
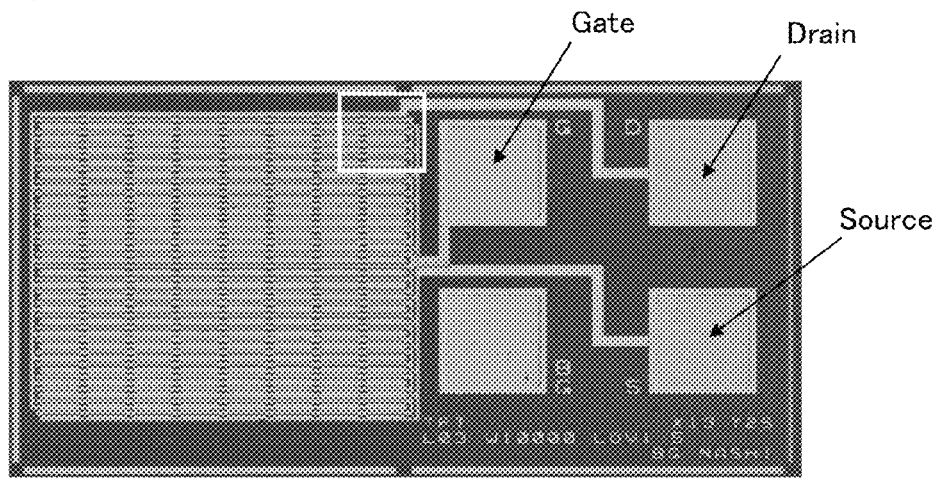
FIGS. 4A and 4B are photographs of an insulated gate transistor including an oxide semiconductor.
Figure 4B:
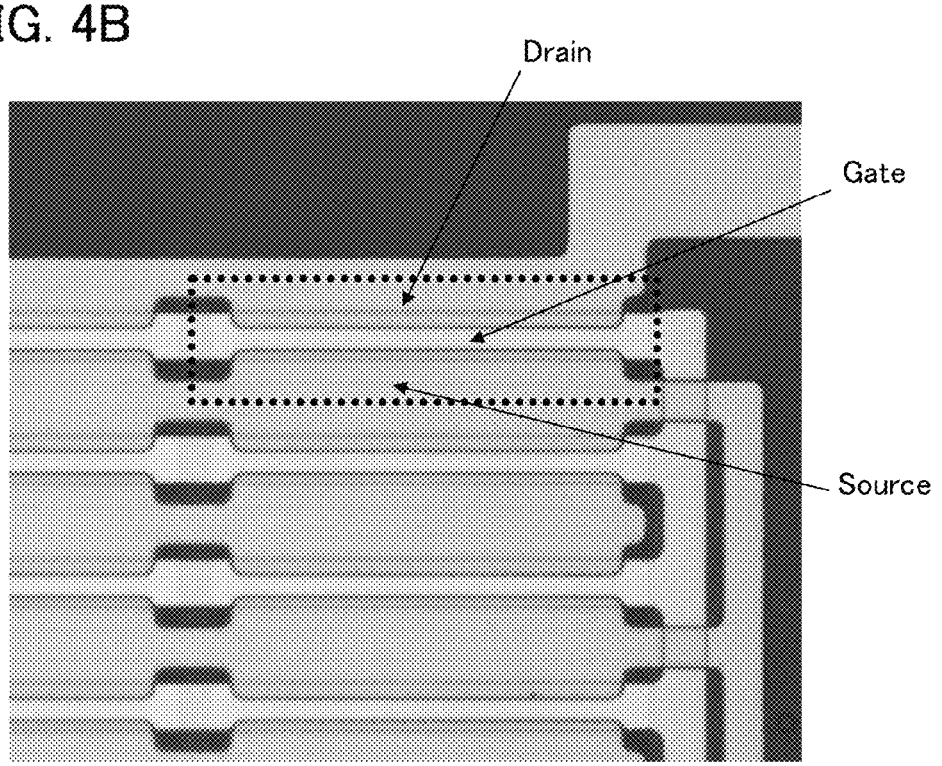

FIG. 3 shows initial characteristics of an insulated gate transistor having a channel length L of 3 μm and a channel width W of 10000 μm in which 200 insulated gate transistors each having a channel length L of 3 μm and a channel width W of 50 μm are connected in parallel. In addition, FIG. 4A illustrates a top view and FIG. 4B shows a partly enlarged view thereof. A region enclosed by a dotted line in FIG. 4B is an insulated gate transistor of one stage having a channel length L of 3 μm, a channel width W of 50 μm, and a Lov length of 1.5 μm. In order to measure initial characteristics of the insulated gate transistor, the change characteristics of the source-drain current (hereinafter referred to as a drain current or ID), i.e., VG-ID characteristics, were measured under the conditions where the substrate temperature is room temperature, the voltage between a source and a drain (hereinafter referred to as a drain voltage or VD) is 10 V, and the voltage between the source and a gate (hereinafter, a gate voltage or VG) varies between −20 V and +20 V. Note that FIG. 3 shows VG in the range of −20 V to +5 V.

As shown in FIG. 3, the insulated gate transistor having a channel width W of 10000 μm has an off current of $1 \times 10^{-13}$ A or less when VD is 1 V and 10 V, which is less than or equal to the resolution (100 fA) of a measurement device (a semiconductor parameter analyzer, Agilent 4156C manufactured by Agilent Technologies Inc.).

In other words, having an electrical characteristic of normally off, the insulated gate transistor can operate so that the drain current per unit channel width of the insulated gate transistor (that is, the value obtained by dividing the drain current by the channel width (unit: μm)) can be 100 aA/μm or less, preferably 10 aA/μm, more preferably 1 aA/μm when the drain voltage is a given voltage within the range of 1 V to 10 V.

A method for manufacturing the insulated gate transistor used for the measurement will be described.

First, a silicon nitride layer was formed as a base film over a glass substrate by a CVD method, and a silicon oxynitride layer was formed over the silicon nitride layer. Over the silicon oxynitride layer, a tungsten layer was formed as a gate electrode layer by a sputtering method. Here, the tungsten layer was selectively etched to form the gate electrode layer.

Next, a silicon oxynitride layer having a thickness of 100 nm was formed as a gate insulating layer over the gate electrode layer by a CVD method.

Then, an oxide semiconductor film having a thickness of 50 nm was formed over the gate insulating layer by a sputtering method with the use of an In—Ga—Zn—O-based metal oxide semiconductor target (in a molar ratio, $In_2O_3:Ga_2O_3:ZnO=1:1:2$). Here, the oxide semiconductor film was selectively etched to form an island-shaped oxide semiconductor layer.

After that, first heat treatment was performed on the oxide semiconductor layer in a nitrogen atmosphere in a clean oven at 450° C. for one hour.

Next, a titanium layer (having a thickness of 150 nm) was formed as a source electrode layer and a drain electrode layer over the oxide semiconductor layer by a sputtering method. Here, by selectively etching the titanium layer, the source electrode layer and the drain electrode layer were formed so that each insulated gate transistor has a channel length L of 3 μm and a channel width W of 50 μm. The insulated gate transistor having a channel length L of 3 μm and a channel width W of 10000 μm was obtained by connecting 200 insulated gate transistors each having a channel length L of 3 μm and a channel width W of 50 μm in parallel.

Then, a silicon oxide layer was formed as a protective insulating layer to a thickness of 300 nm in contact with the oxide semiconductor layer by a reactive sputtering method. Here, the silicon oxide layer which is a protective layer was selectively etched so that opening portions were formed over the gate electrode layer, the source electrode layer, and the drain electrode layer. After that, second heat treatment was performed at 250° C. for one hour in a nitrogen atmosphere.

Then, heat treatment was performed at 150° C. for 10 hours before the measurement of VG-ID characteristics.

Through the above process, a bottom-gate insulated gate transistor was manufactured.

The reason why the off-current of the insulated gate transistor is approximately $1 \times 10^{-13}$ A as shown in FIG. 3 is that the concentration of hydrogen in the oxide semiconductor layer and oxygen vacancy in the oxide semiconductor layer could be sufficiently reduced in the above manufacturing process. The concentration of hydrogen in the oxide semiconductor layer is $5 \times 10^{19}$ atoms/cm$^3$ or less, preferably $5 \times 10^{18}$ atoms/cm$^3$ or less, more preferably $5 \times 10^{17}$ atoms/cm$^3$ or less, still more preferably $1 \times 10^{16}$ atoms/cm$^3$ or less. Note that the concentration of hydrogen in the oxide semiconductor layer was measured by secondary ion mass spectrometry (SIMS).

Although the example of using an In—Ga—Zn—O-based oxide semiconductor is described above, an embodiment of the present invention is not particularly limited thereto. Another oxide semiconductor material, such as an In—Sn—Zn—O-based oxide semiconductor, a Sn—Ga—Zn—O-based oxide semiconductor, an Al—Ga—Zn—O-based oxide semiconductor, a Sn—Al—Zn—O-based oxide semiconductor, an In—Zn—O-based oxide semiconductor, an In—Sn—O-based oxide semiconductor, a Sn—Zn—O-based oxide semiconductor, an Al—Zn—O-based oxide semiconductor, an In—O-based oxide semiconductor, a Sn—O-based oxide semiconductor, or a Zn—O-based oxide semiconductor, may be used. As another oxide semiconductor material, an In—Al—Zn—O-based oxide semiconductor mixed with Al of 2.5 wt % to 10 wt % inclusive or an In—Zn—O-based oxide semiconductor mixed with Si of 2.5 wt % to 10 wt % inclusive may be used.

The carrier concentration of the oxide semiconductor layer measured in C-V measurement is equivalent to that of silicon or less than or equal to that of silicon.

The insulated gate transistor may have a channel length L of 10 nm to 1000 nm inclusive. In that case, circuit operation speed can be increased, and power consumption can be further reduced since the off current is extremely small.

In addition, in circuit design, the oxide semiconductor layer can be regarded as an insulator when the insulated gate transistor is off.

After that, the temperature characteristics of off current of the insulated gate transistor manufactured in this embodiment were evaluated. Temperature characteristics are important in considering the environmental resistance, maintenance of performance, or the like of an end product in which the insulated gate transistor is used. It is needless to say that a smaller amount of change is more preferable, which increases design flexibility of a product.

For the temperature characteristics, the VG-ID characteristics were obtained using a thermostat under the conditions where substrates provided with insulated gate transistors are kept at respective constant temperatures of −30° C., 0° C., 25° C., 40° C., 60° C., 80° C., 100° C., and 120° C., the drain voltage is 6 V, and the gate voltage varies between −20 V and +20V.

Figure 5A:
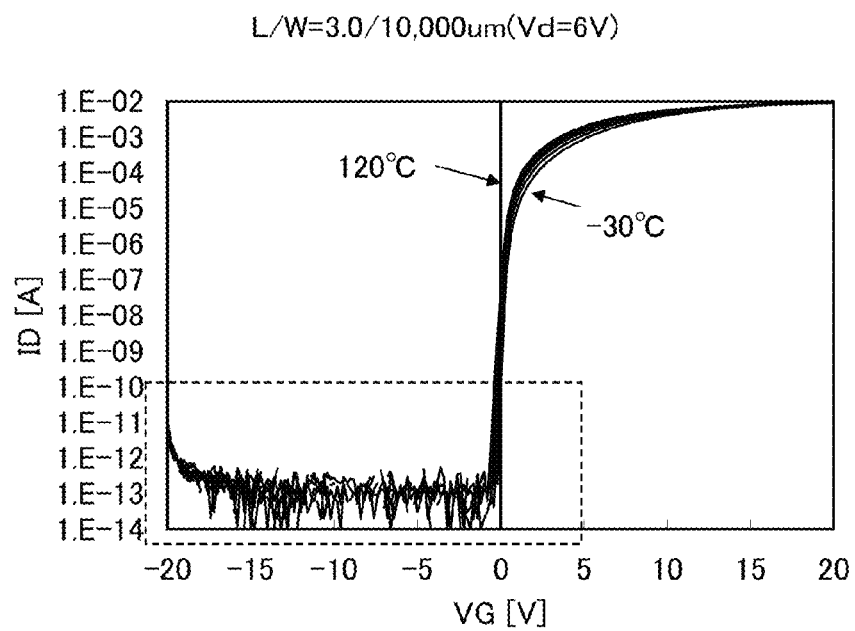
FIGS. 5A and 5B show VG-ID characteristics (temperature characteristics) of an insulated gate transistor including an oxide semiconductor.
Figure 5B:
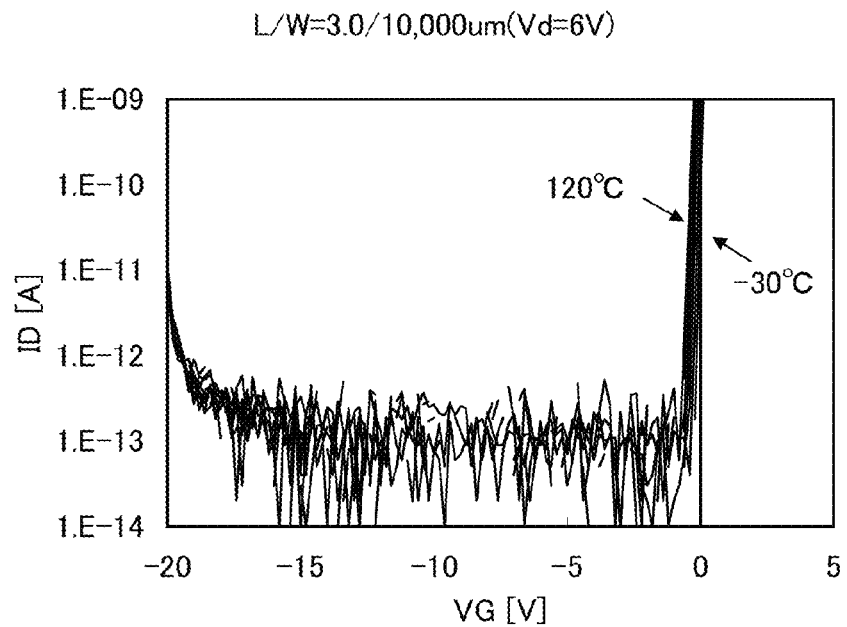

FIG. 5A shows VG-ID characteristics measured at the above temperatures and superimposed on one another, and FIG. 5B shows an enlarged view of a range of off current enclosed by a dotted line in FIG. 5A. The rightmost curve indicated by an arrow in the diagram is a curve obtained at −30° C.; the leftmost curve is a curve obtained at 120° C.; and curves obtained at the other temperatures are located between the rightmost curve and the leftmost curve. The temperature dependence of on current can hardly be observed. On the other hand, as clearly shown also in the enlarged view of FIG. 5B, off current is $1 \times 10^{-12}$ A or less, which is near the resolution of the measurement device, at all temperatures except in the vicinity of a gate voltage of −20 V, and the temperature dependence of off current is not observed. In other words, even at a high temperature of 120° C., the off current is kept $1\times10^{-12}$ A or less, and given that the channel width W is 10000 µm, it can be seen that the off current is significantly small.

Thus, an insulated gate transistor including an intrinsic or substantially intrinsic oxide semiconductor obtained by high purification (purified oxide semiconductor) shows almost no dependence of an off current on temperature. It can be said that an oxide semiconductor does not show dependence on temperature when purified because the conductivity type becomes extremely close to an intrinsic type and the Fermi level is located in the middle of the forbidden band, as illustrated in the band diagram of FIG. 7A. That also results from the fact that the oxide semiconductor has an energy gap of 3 eV or more and includes very few thermally excited carriers. In addition, the source region and the drain region are in a degenerated state, which is also a factor for no dependence on temperature. The insulated gate transistor is operated mainly with carriers which are injected from the degenerated source region to the oxide semiconductor, and the above characteristics (independence of off current from temperature) can be explained by independence of carrier concentration from temperature. This extremely low off current will be described with reference to energy band diagrams below.

Figure 6:
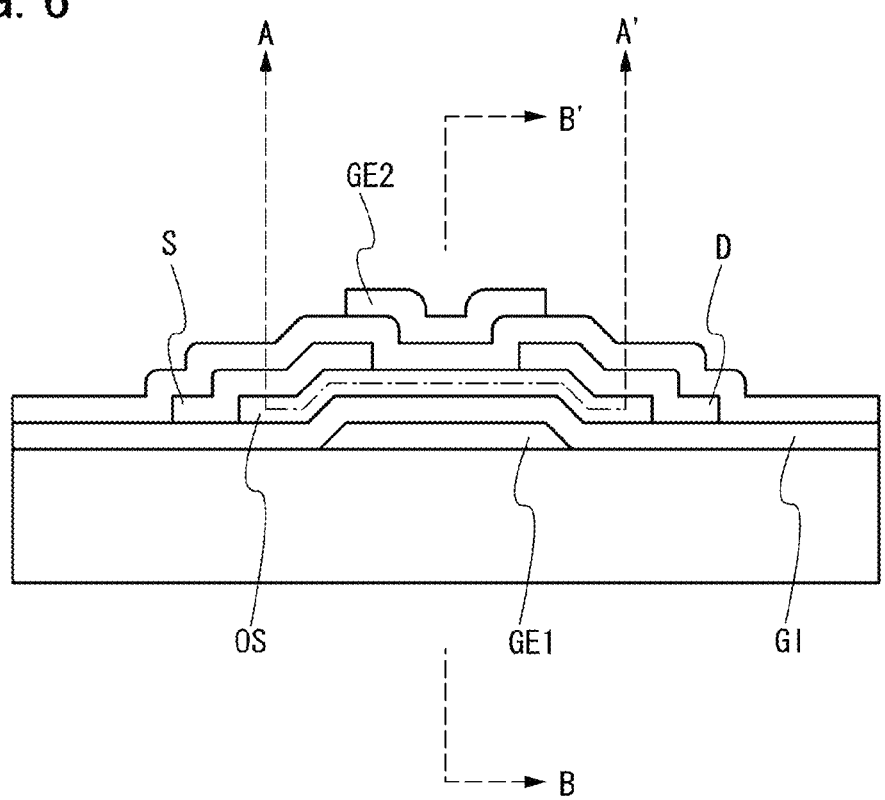
FIG. 6 is a longitudinal cross-sectional view of an inverted-staggered insulated gate transistor including an oxide semiconductor.

FIG. 6 is a longitudinal cross-sectional view of an inverted-staggered insulating gate transistor including an oxide semiconductor. An oxide semiconductor layer (OS) is provided over a gate electrode layer (GE1) with a gate insulating layer (GI) interposed therebetween, and a source electrode layer (S) and a drain electrode layer (D) are provided thereover.

FIGS. 7A and 7B are energy band diagrams (schematic diagrams) of a cross section along A-A' in FIG. 6. FIG. 7A illustrates the case where the potential supplied to the source is equal to the potential supplied to the drain ($V_D$=0 V), and FIG. 7B illustrates the case where a positive potential with respect to the source is supplied to the drain ($V_D$>0).

FIGS. 8A and 8B are energy band diagrams (schematic diagrams) of a cross section along B-B' in FIG. 6. FIG. 8A illustrates a state where a positive potential ($V_G$>0) is supplied to the gate (G1), that is, an on state where a carrier (electron) flows between a source and a drain. FIG. 8B illustrates a state where a negative potential ($V_G$<0) is supplied to the gate (G1), that is, an off state (where a minority carrier does not flow).

Figure 9:
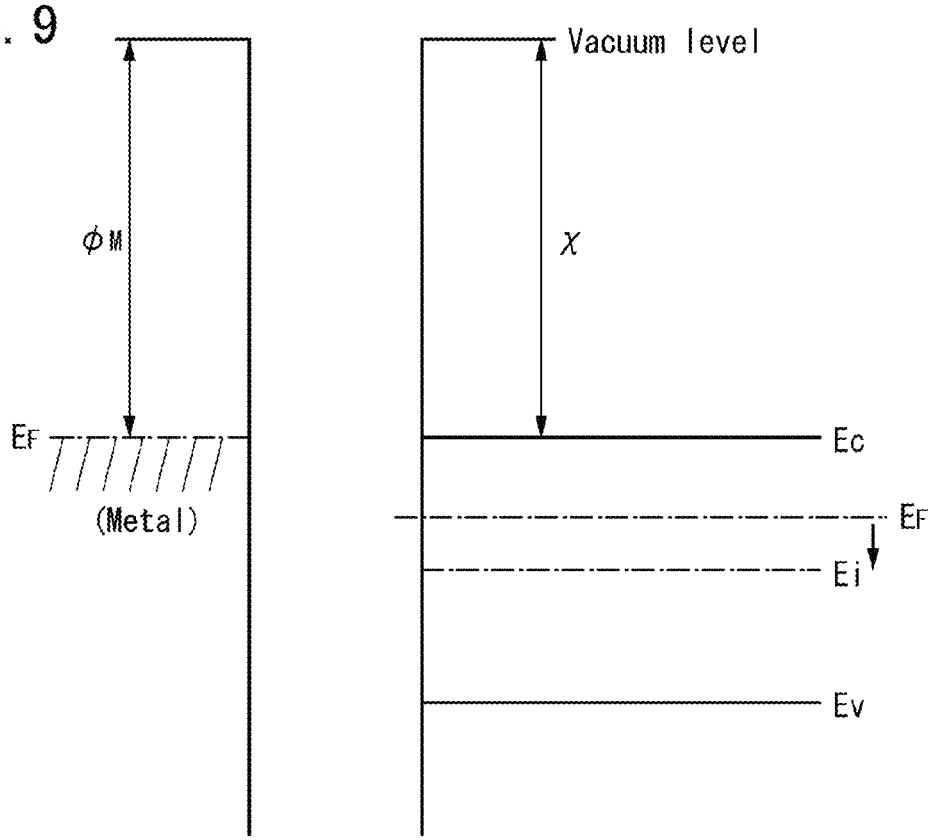
FIG. 9 shows a relation between the vacuum level, the work function of a metal ($\phi_M$), and the electron affinity of an oxide semiconductor ($\chi$).

FIG. 9 illustrates the relation between the vacuum level, the work function of metal ($\phi_M$), and the electron affinity of an oxide semiconductor ($\chi$).

A conventional oxide semiconductor is generally n-type, and in that case, the Fermi level ($E_f$) is distant from the intrinsic Fermi level ($E_i$) in the center of the band gap and is located near the conduction band. It is known that hydrogen in an oxide semiconductor partly becomes a donor and is one of the causes to produce an n-type oxide semiconductor.

In contrast, an oxide semiconductor according to an embodiment of the present invention is an oxide semiconductor that is made to be intrinsic (i-type) or substantially intrinsic in the following manner: hydrogen, which is an n-type impurity, is removed from the oxide semiconductor for high purification, so that the oxide semiconductor includes an impurity other than the main component of the oxide semiconductor as little as possible. That is, a feature of an embodiment of the present invention is that an oxide semiconductor is made to be or be close to a highly-purified i-type (intrinsic) semiconductor not by addition of an impurity but by reduction of impurities such as hydrogen and water to a minimum. Thus, the Fermi level ($E_f$) can be comparable with the intrinsic Fermi level ($E_i$).

It is said that in the case where the band gap ($E_g$) of an oxide semiconductor is 3.15 eV, the electron affinity ($\chi$) is 4.3 eV. The work function of titanium (Ti) contained in a source electrode and a drain electrode is substantially equal to the electron affinity ($\chi$) of an oxide semiconductor. In this case, a Schottky barrier against an electron is not formed at the interface between metal and an oxide semiconductor.

That is to say, in the case where the work function of metal ($\phi_M$) is equal to the electron affinity of an oxide semiconductor ($\chi$), such an energy band diagram (schematic diagram) in FIG. 7A is shown when the metal and the oxide semiconductor are in contact with each other.

In FIG. 7B, a black dot (●) indicates an electron. When a positive potential is supplied to the drain, the electron crosses over a barrier (h) to be injected into the oxide semiconductor, and flows to the drain. In that case, the height of the barrier (h) depends on a gate voltage and a drain voltage. When a positive drain voltage is applied, the height of the barrier (h) is lower than the height of the barrier in FIG. 7A where a voltage is not applied, that is, half the band gap ($E_g$).

At that time, as illustrated in FIG. 8A, the electron injected into the oxide semiconductor flows through the oxide semiconductor. Further, in FIG. 8B, when a negative potential is supplied to the gate electrode (G1), a hole which is a minority carrier does not exist substantially. Thus, the current value is as close to 0 as possible.

For example, even in an insulated gate transistor having a channel width W of $1\times10^4$ µm and a channel length of 3 µm, an off current can be less than or equal to $10^{-13}$ A at room temperature and a subthreshold swing (S value) can be 0.1 V/dec. (the thickness of the gate insulating layer: 100 nm).

Note that the intrinsic carrier concentration of a silicon semiconductor is $1.45\times10^{10}$/cm$^3$ (300 K) and carriers exist even at room temperature. This means that thermally excited carriers exist even at room temperature. Further, since the band gap of a silicon semiconductor is 1.12 eV, the off current of a transistor using a silicon semiconductor greatly fluctuates depending on temperature.

Therefore, not by simply using an oxide semiconductor having a wide band gap for a transistor but by highly purifying the oxide semiconductor such that an impurity other than a main component can be prevented from being contained therein as much as possible so that the carrier concentration is less than $1\times10^{12}$/cm$^3$, preferably less than $1\times10^{11}$/cm$^3$, more preferably less than or equal to $1.45\times10^{10}$/cm$^3$, which is an intrinsic carrier concentration of silicon, carriers to be thermally excited at a practical operation temperature can be mostly eliminated, and the transistor can operate only with electrons that are injected from the source side. Accordingly, it is possible to obtain a transistor whose off current is reduced to $1\times10^{-13}$ A or less and is hardly changed due to temperature change, whereby the transistor can operate in an extremely stable manner.

A technical idea of an embodiment of the present invention is that an impurity is not added to an oxide semiconductor and on the contrary the oxide semiconductor itself is highly purified by removing an impurity such as water or hydrogen which undesirably exists therein. In other words, a feature of one embodiment of the present invention is that an oxide semiconductor itself is highly purified by removing water or hydrogen which forms a donor level and by supplying of oxygen to the oxide semiconductor which is made to be in an oxygen-vacant state at the time of the removal.

In an oxide semiconductor, even shortly after the film formation, hydrogen is observed on the order of $10^{20}$/cm$^3$ by secondary ion mass spectrometry (SIMS). One technical idea of an embodiment of the present invention is to highly purify an oxide semiconductor to obtain an electrically i-type (intrinsic) semiconductor by intentionally removing an impurity such as water or hydrogen which forms a donor level and further by adding oxygen, which decreases at the same time as removing water or hydrogen, to the oxide semiconductor.

As a result, it is preferable that the oxide semiconductor contain as little hydrogen and carriers as little as possible. The oxide semiconductor is a purified i-type (intrinsic) semiconductor from which carriers have been eliminated and to which a meaning as a path of carriers (electrons) supplied from a source is given, rather than intentionally including carriers of current, when used for an insulated gate transistor.

As a result, carriers are completely eliminated or significantly reduced from the oxide semiconductor, whereby an off current of an insulated gate transistor can be decreased, which is a technical idea of an embodiment of the present invention. That is to say, as a criterion, the concentration of hydrogen should be $5 \times 10^{19}/cm^3$ or less, preferably $5 \times 10^{18}/cm^3$ or less, more preferably $5 \times 10^{17}/cm^3$ or less, still more preferably $1 \times 10^{16}/cm^3$ or less. The carrier concentration should be less than $1 \times 10^{12}/cm^3$, preferably less than $1 \times 10^{11}/cm^3$, more preferably less than or equal to $1.45 \times 10^{10}/cm^3$, which is an intrinsic carrier concentration of silicon. According to a technical idea of an embodiment of the present invention, the ideal hydrogen concentration and carrier concentration are zero or close to zero.

In addition, as a result, the oxide semiconductor functions as a path, and the oxide semiconductor itself is an i-type (intrinsic) semiconductor which is highly purified so as to supply no carriers or extremely few carriers, and carriers are supplied by an electrode on the source or drain side.

Therefore, it is preferable that an off current be as small as possible, and a feature of an embodiment of the present invention is that in characteristics of an insulated gate transistor to which a drain voltage of 1 V to 10 V is applied, the off current per micrometer in channel width is 100 aA/μm or less, preferably 10 aA/μm or less, more preferably 1 aA/μm or less.

This embodiment can be implemented in appropriate combination with any of the structures described in the other embodiments and the example.

Embodiment 3

In an embodiment of the present invention, an oxide semiconductor which has been made to be intrinsic or substantially intrinsic is applied to an insulated gate transistor. It can be said that in an intrinsic or substantially intrinsic semiconductor, depletion layer is likely to extend and thus a short-channel effect occurs easily. In this embodiment, described will be the range of the channel lengths and the ranges of the thicknesses of an oxide semiconductor layer and a gate insulating layer of an n-channel insulated gate transistor, which allow a short-channel effect to be suppressed.

In general, when the channel length is short, depletion layers are likely to extend from a source region and a drain region to a channel region, so that control of on and off with a gate voltage is difficult. In other words, a so-called short-channel effect is likely to occur. The width of the depletion layer depends on the concentration of donors in the channel; as the concentration of donors is reduced, the width of the depletion layer is likely to increase. Particularly in the insulated gate transistor according to an embodiment of the present invention, a short-channel effect occurs easily because an oxide semiconductor layer that is an intrinsic or substantially intrinsic semiconductor with a significantly low carrier concentration is used for a channel formation region.

When a short-channel effect occurs, for example, the threshold voltage decreases, the subthreshold swing and the off current increase, and the withstand voltage between a source and a drain decreases; thus, properties of a transistor get considerably worse. Previously, in most cases, the concentration of donors or acceptors in a channel is increased in a silicon semiconductor so that a short-channel effect can be suppressed. That is because a source or a drain and a channel of an insulated gate transistor can be controlled by pn junction. However, in the oxide semiconductor used in an embodiment of the present invention, in general, it is difficult to raise the concentration of acceptors to increase holes and to form pn junction and it is not preferable to raise the concentration of donors in a channel because an off current is increased. According to an embodiment of the present invention, an intrinsic or substantially intrinsic oxide semiconductor layer is used for a channel formation layer. Therefore, instead of raising the concentration of donors or acceptors in a channel, it is effective to reduce the thickness of the oxide semiconductor layer so that extension of depletion layer due to a drain electrical field can be suppressed as much as possible and to reduce the thickness of a gate insulating layer to increase a gate electrical field so that the influence of the drain electrical field is relatively decreased, in suppressing a short-channel effect. In an embodiment of the present invention, results obtained by the following scientific calculation will be described focusing on the threshold voltage. The preferred ranges of thicknesses of an oxide semiconductor layer and a gate insulating layer with respect to the limited range of channel lengths, which allow a short-channel effect to be suppressed to the utmost, are calculated.

Figure 10:
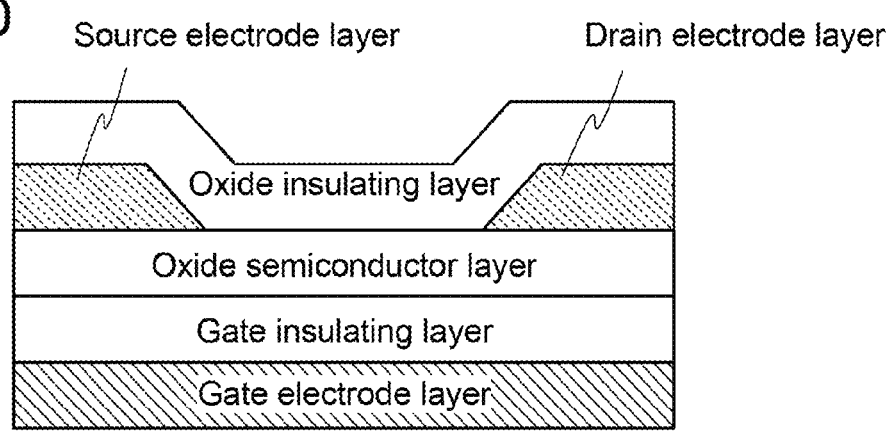
FIG. 10 illustrates a structural model of an insulated gate transistor used for scientific calculation.
Figure 11A:
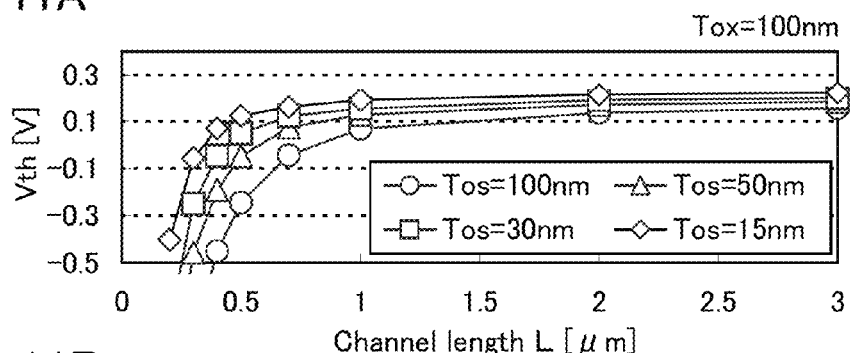
FIGS. 11A to 11D shows results obtained by calculating threshold voltages by scientific calculation.
Figure 11B:
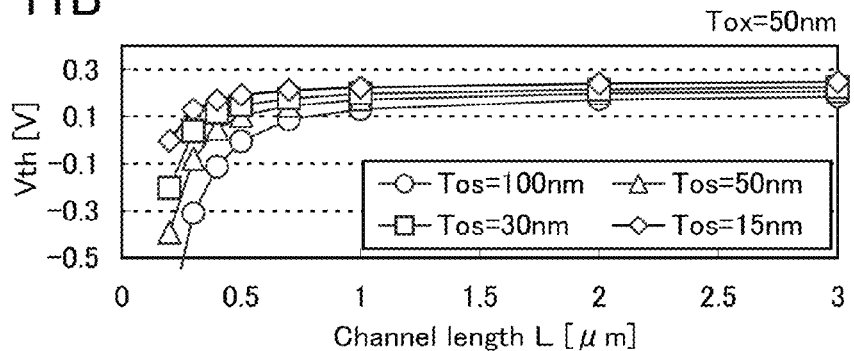
Figure 11C:
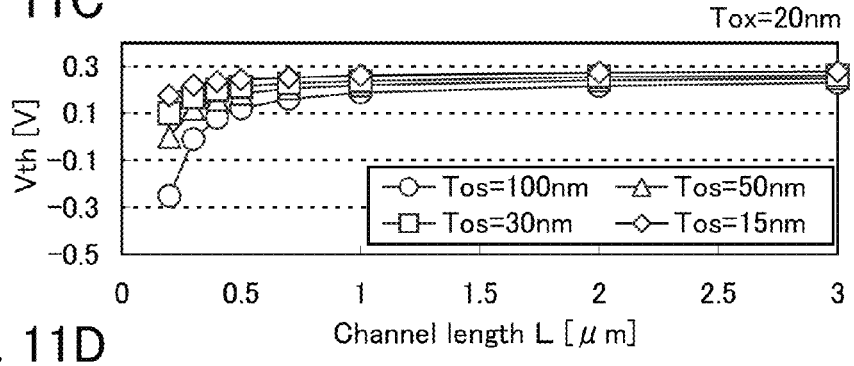
Figure 11D:
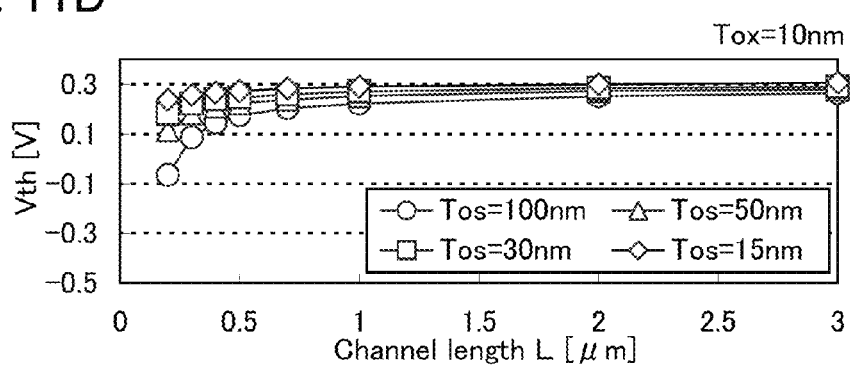

FIG. 10 illustrates a structural model of an insulated gate transistor used for the scientific calculation. The insulated gate transistor is an inverted-staggered type adopted in Embodiments 1 and 2 similarly and includes a gate electrode layer, a gate insulating layer, an oxide semiconductor layer, a source electrode layer, a drain electrode layer, an oxide insulating layer formed in contact with the source electrode layer, the drain electrode layer, and the oxide semiconductor layer. Note that a structural model of a bottom-contact type or a top-gate type may be used and in that case, an equivalent value is obtained as ΔVth described below.

Here, for example, tungsten or molybdenum is used for the gate electrode layer, a silicon oxynitride film is used for the gate insulating layer, an In—Ga—Zn—O film is used for the oxide semiconductor layer, and titanium is used for the source electrode layer and the drain electrode layer. Table 1 shows parameters used for the scientific calculation. Note that Nd, Eg, φm, and χ represent concentration of donors, a band gap, a work function, and electron affinity, respectively. The calculation is performed using numeric values of parameters, and any other materials may be used as long as they have equivalent numeric values. Items shown by hyphens in the table are not used for the calculation.

TABLE 1

| | Material | Range of thickness (nm) | Nd (cm$^{-3}$) | Eg (eV) | φμ (εζ) | χ (eV) | Relative permittivity |
|---|---|---|---|---|---|---|---|
| Gate electrode layer | W (Mo) | — | — | — | 4.7 | — | — |
| Gate insulating layer | SiON | 10~100 | — | — | — | — | 4.1 |
| Oxide semiconductor layer | IGZO | 15~500 | 1.7E-8 (=Ni) | 3.15 | — | 4.3 | 15 |

TABLE 1-continued

| Material | Range of thickness (nm) | Nd (cm$^{-3}$) | Eg (eV) | φμ (eζ) | χ (eV) | Relative permittivity |
|---|---|---|---|---|---|---|
| Source/drain electrode layer | Ti | — | — | — | 4.3 | — |

The range of the channel lengths (L) of the insulated gate transistor, which is an object for the calculation, was 0.2 μm to 3.0 μm inclusive (0.2 μm, 0.3 μm, 0.4 μm, 0.5 μm, 0.7 μm, 1.0 μm, 2.0 μm, and 3.0 μm) in consideration of the range within which a short-channel effect starts to be noticeable and the practical range of a device including an oxide semiconductor. The range of the thicknesses of the gate insulating layer ($T_{ox}$) was 10 nm to 100 nm inclusive (10 nm, 20 nm, 50 nm, and 100 nm). The range of the thicknesses of the oxide semiconductor layer ($T_{os}$) was 15 nm to 500 nm inclusive (15 nm, 30 nm, 50 nm, and 100 nm). Further, the concentration of donors in a channel Nd was assumed to be the intrinsic carrier concentration $N_i$ of an oxide semiconductor, that was, 1.7×10$^{-8}$/cm$^3$. The other items were also assumed to be the numeric values shown in Table 1 and a device simulator "Atlas" manufactured by Silvaco Data Systems Inc. was used for the calculation. As a mobility model, the "constant low field mobility model" was used, and the intrinsic electron mobility and the intrinsic hole mobility were assumed to be 15 cm$^2$/V·sec and 0.1 cm$^2$/V·sec, respectively. In addition, the effective density of states in the conduction band (at the time of 300 K) and the effective density of states in the valence band (at the time of 300 K) were each assumed to be 5×10$^{18}$/cm$^3$, and the threshold voltage at the time when the drain voltage is 1V was calculated from the obtained current-voltage characteristics.

FIGS. 11A to 11D show graphs in which the calculation results in the cases of different thicknesses ($T_{os}$) of the oxide semiconductor layer are plotted, where the horizontal axis and the vertical axis represent channel length (L) and threshold voltage (Vth), respectively. Note that FIGS. 11A to 11D show results in the cases of respective thicknesses ($T_{ox}$) of the gate insulating layer.

Each graph shows the tendency of the threshold voltage to decrease as the channel length is reduced. This is the change in threshold voltage because of a short-channel effect. From the graphs, it can be found that the change in threshold voltage is suppressed as the thicknesses of the oxide semiconductor layer and the gate insulating layer are reduced.

Table 2 collectively shows results, where the maximum of the amount of change in threshold voltage (ΔVth) is assumed to be a difference in threshold voltage between the case where the channel length L is 3.0 μm and the case where the channel length L is 0.2 μm (ΔVth=Vth (L=3.0 μm)−Vth (L=0.2 μm)).

TABLE 2

| Thickness of gate insulating layer [nm] | Thickness of oxide semiconductor layer [nm] | | | | | |
|---|---|---|---|---|---|---|
| | 500 | 200 | 100 | 50 | 30 | 15 |
| 100 | 12.32 | 2.46 | 1.80 | 1.28 | 0.96 | 0.62 |
| 50 | 3.15 | 1.52 | 0.95 | 0.60 | 0.43 | 0.25 |
| 20 | 2.58 | 0.98 | 0.48 | 0.25 | 0.16 | 0.10 |
| 10 | 2.40 | 0.78 | 0.33 | 0.16 | 0.11 | 0.07 |

Here, lower ΔVth is better. To increase design flexibility of a semiconductor device, an element is formed when the thicknesses of the oxide semiconductor layer and the gate insulating layer are set so that ΔVth can be less than 0.5 V, preferably 0.25 V or less, more preferably 0.1V or less.

To suppress ΔVth to less than 0.5 V, it is preferable to set the thicknesses of the gate insulating layer and the oxide semiconductor layer to 10 nm to 20 nm inclusive and 15 nm to 100 nm inclusive, respectively, or 20 nm to 50 nm inclusive and 15 nm to 30 nm inclusive, respectively. To suppress ΔVth to 0.25 V or less, it is preferable to set the thicknesses of the gate insulating layer and the oxide semiconductor layer to 10 nm to 20 nm inclusive and 15 nm to 50 nm inclusive, respectively, or 20 nm to 50 nm inclusive and 15 nm or less, respectively. Further, to suppress ΔVth to 0.1 V or less, it is preferable to set the thicknesses of the gate insulating layer and the oxide semiconductor layer to 10 nm to 20 nm inclusive and 15 nm or less, respectively.

Thus, target ΔVth between the cases of different channel lengths is calculated by the scientific calculation and a device is formed when the thicknesses of the oxide semiconductor layer and the gate insulating layer are set so that ΔVth can be small. Accordingly, design flexibility of a semiconductor device can be increased.

This embodiment can be implemented in appropriate combination with any of the structures described in the other embodiments and the example.

Embodiment 4

A semiconductor device using the insulated gate transistor described in any of Embodiments 1 to 3 can be applied to a variety of electronic appliances (including a game machine). Examples of electronic devices are a television device (also referred to as a television or a television receiver), a computer, computer peripheral equipment, a camera such as a digital camera or a digital video camera, a digital photo frame, a mobile phone (also referred to as a mobile phone handset or a mobile phone device), a portable game console, a portable information terminal, an audio reproducing device, a large-sized game machine such as a pachinko machine, and the like.

Figure 12A:
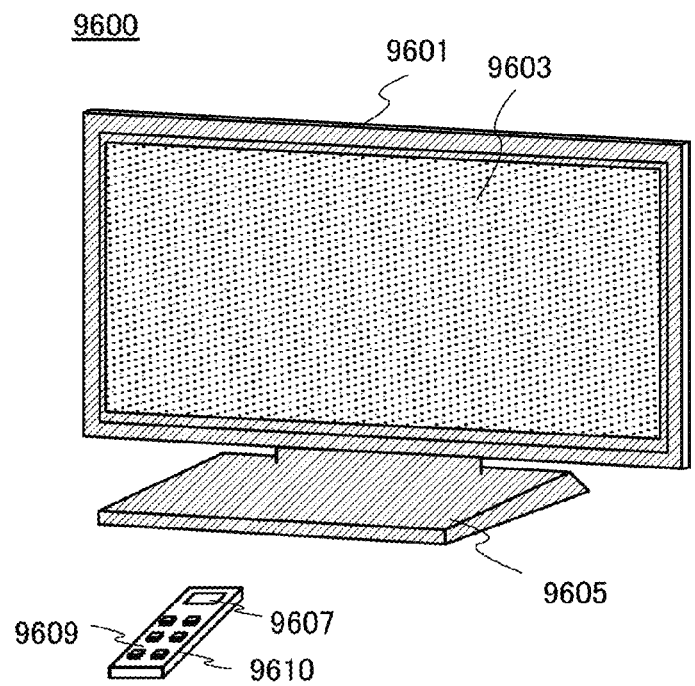
FIGS. 12A and 12B illustrate electronic devices.

FIG. 12A illustrates an example of a television device. In a television device 9600, a display portion 9603 is incorporated in a housing 9601. The display portion 9603 can display images. Here, the housing 9601 is supported by a stand 9605.

The television device 9600 can be operated with an operation switch of the housing 9601 or a separate remote controller 9610. Channels and volume can be switched and controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television device 9600 is provided with a receiver, a modem, and the like. With the use of the receiver, general television broadcasting can be received. Moreover, when the television device is connected to a communication network with or without wires via the modem, one-way (from a sender to a receiver) or two-way (between a sender and a receiver or between receivers) information communication can be performed.

Figure 12B:
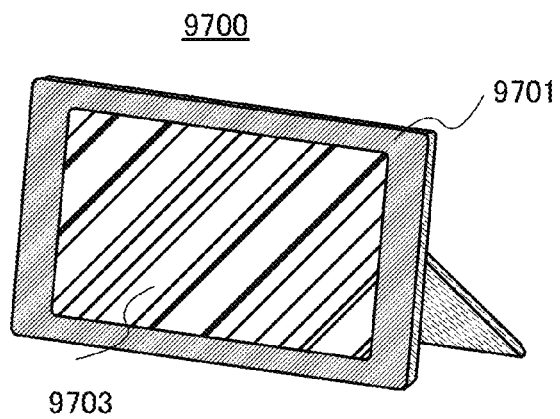

FIG. 12B illustrates an example of a digital photo frame. For example, in a digital photo frame 9700, a display portion 9703 is incorporated in a housing 9701. The display portion 9703 can display a variety of images. For example, the display portion 9703 can display data of an image taken with a digital camera or the like and function as a normal photo frame Note that the digital photo frame 9700 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

Figure 13A:
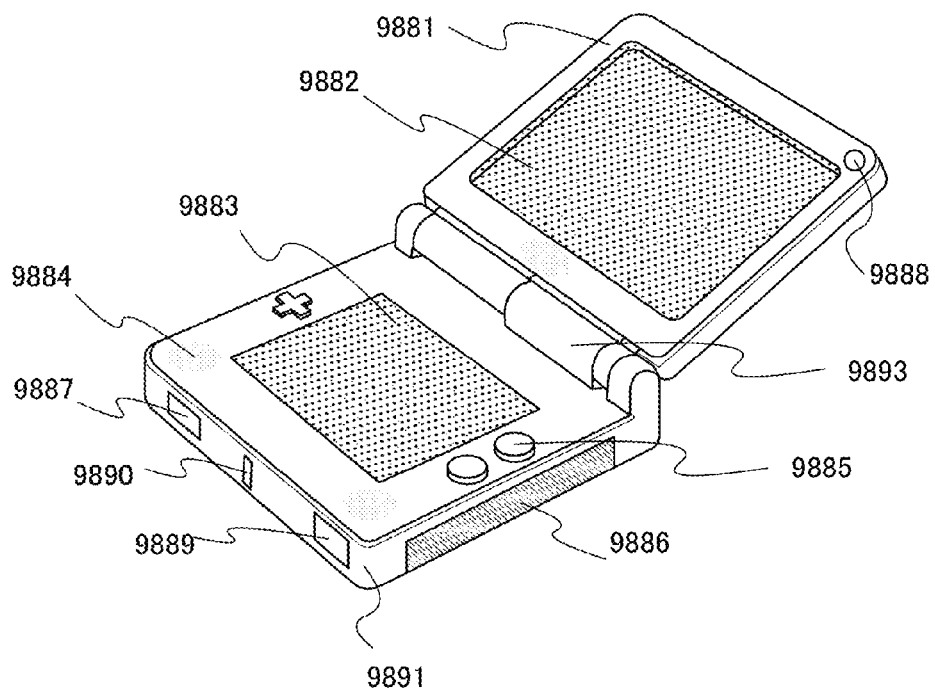
FIGS. 13A and 13B illustrate electronic devices.

FIG. 13A is a portable game machine and is constituted by two housings of a housing 9881 and a housing 9891 which are connected with a joint portion 9893 so that the portable game machine can be opened or folded. A display portion 9882 and a display portion 9883 are incorporated in the housing 9881 and the housing 9891, respectively. In addition, the portable game machine illustrated in FIG. 13A is provided with a speaker portion 9884, a recording medium insert portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electrical field, current, voltage, electric power, radial ray, flow rate, humidity, gradient, vibration, odor, or infrared ray), and a microphone 9889), and the like. It is needless to say that the structure of the portable game machine is not limited to the above and other structures provided with at least a semiconductor device of the present invention may be employed. The portable game machine may include other accessories, as appropriate. The portable game machine illustrated in FIG. 13A has a function of reading a program or data stored in the recording medium to display it on the display portion, and a function of sharing information with another portable game machine by wireless communication. Note that a function of the portable game machine illustrated in FIG. 13A is not limited to the above, and the portable game machine can have a variety of functions.

Figure 13B:
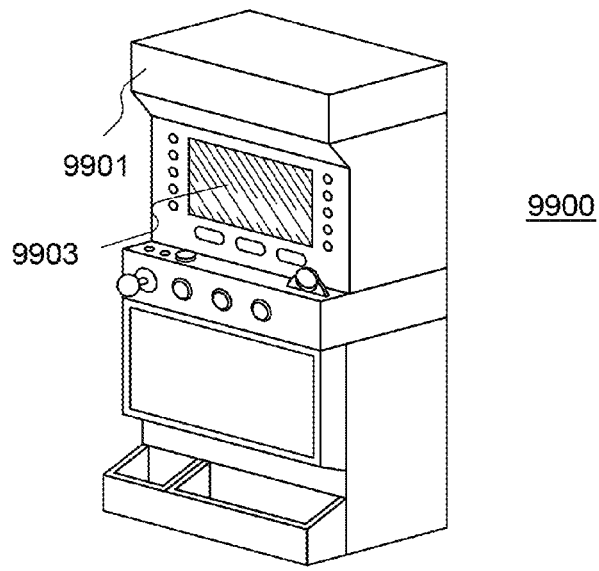

FIG. 13B illustrates an example of a slot machine which is a large-sized game machine. In a slot machine 9900, a display portion 9903 is incorporated in a housing 9901. In addition, the slot machine 9900 includes an operation means such as a start lever or a stop switch, a coin slot, a speaker, and the like. It is needless to say that the structure of the slot machine 9900 is not limited to the above and other structures provided with at least a semiconductor device of the present invention may be employed. The slot machine 9900 may include other accessories, as appropriate.

Figure 14A:
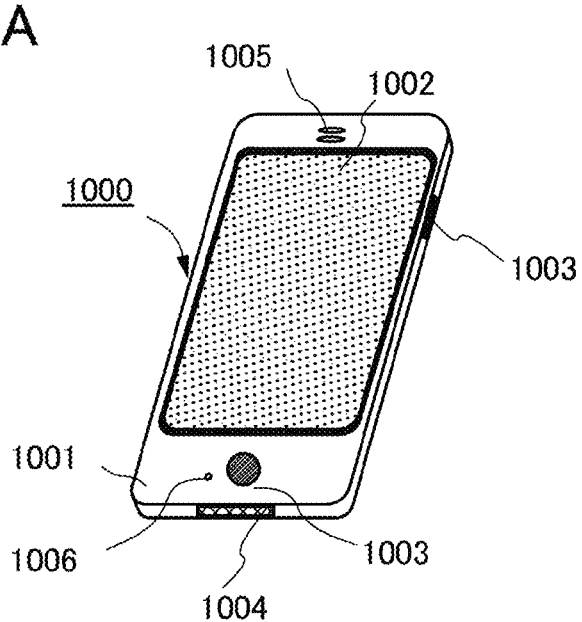
FIGS. 14A and 14B illustrate electronic devices.

FIG. 14A illustrates an example of a mobile phone. A mobile phone 1000 includes a display portion 1002 incorporated in a housing 1001, an operation button 1003, an external connection port 1004, a speaker 1005, a microphone 1006, and the like.

When the display portion 1002 illustrated in FIG. 14A is touched with a finger or the like, data can be input into the mobile phone 1000. Furthermore, operations such as making calls and composing mails can be performed by touching the display portion 1002 with a finger or the like.

There are mainly three screen modes of the display portion 1002. The first mode is a display mode mainly for displaying images. The second mode is an input mode mainly for inputting data such as text. The third mode is a display-and-input mode in which two modes of the display mode and the input mode are combined.

For example, in a case of making a call or composing a mail, a text input mode mainly for inputting text is selected for the display portion 1002 so that text displayed on a screen can be input. In that case, it is preferable to display a keyboard or number buttons on substantially the entire area of the screen of the display portion 1002.

When a detection device including a sensor for detecting inclination, such as a gyroscope or an acceleration sensor, is provided inside the mobile phone 1000, display in the screen of the display portion 1002 can be automatically switched by determining the installation direction of the mobile phone 1000 (whether the mobile phone 1000 is placed horizontally or vertically for a landscape mode or a portrait mode).

The screen modes are switched by touching the display portion 1002 or operating the operation button 1003 of the housing 1001. Alternatively, the screen modes may be switched depending on the kind of the image displayed on the display portion 1002. For example, when a signal of an image displayed on the display portion is a signal of moving image data, the screen mode is switched to the display mode. When the signal is a signal of text data, the screen mode is switched to the input mode.

Further, in the input mode, when input by touching the display portion 1002 is not performed for a certain period while a signal detected by the optical sensor in the display portion 1002 is detected, the screen mode may be controlled so as to be switched from the input mode to the display mode.

The display portion 1002 may function as an image sensor. For example, an image of a palm print, a fingerprint, or the like is taken when the display portion 1002 is touched with a palm or a finger, whereby personal identification can be performed. Further, by providing a backlight or a sensing light source which emits a near-infrared light in the display portion, an image of a finger vein, a palm vein, or the like can be taken.

Figure 14B:
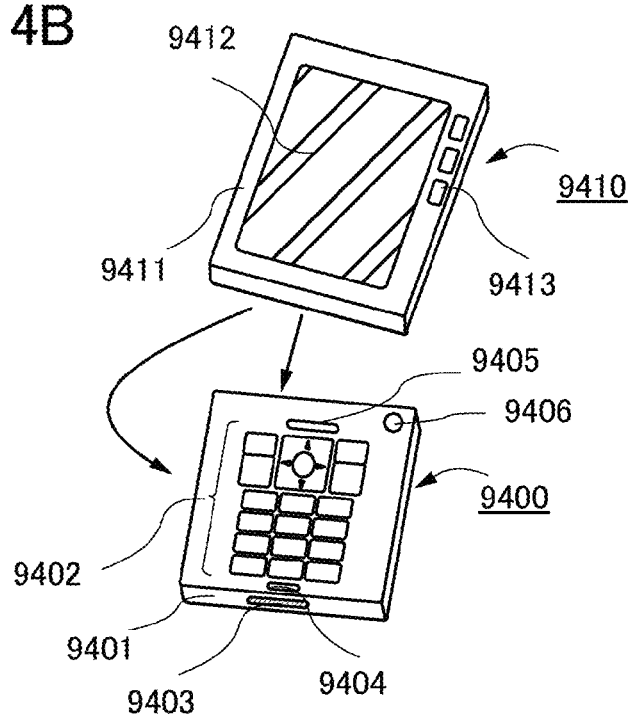

FIG. 14B also illustrates an example of a mobile phone. The mobile phone in FIG. 14B includes an a display device 9410 in which a display portion 9412 and an operation button 9413 are included in a housing 9411, and a communication device 9400 in which operation buttons 9402, an external input terminal 9403, a microphone 9404, a speaker 9405, and a light-emitting portion 9406 that emits light when a phone call is received are included in a housing 9401. The display device 9410 having a display function can be detached from or attached to the communication device 9400 having a telephone function in two directions as indicated by arrows. Thus, a short axis of the display device 9410 can be attached to a short axis of the communication device 9400, and a long axis of the display device 9410 can be attached to a long axis of the communication device 9400. In addition, when only the display function is needed, the display device 9410 can be detached from the communication device 9400 and used alone. Images or input information can be transmitted or received by wireless or wire communication between the communication device 9400 and the display device 9410, each of which has a rechargeable battery.

Note that the structure described in this embodiment can be used in combination with any of the structures described in the other embodiments, as appropriate.

EXAMPLE

In this example, described will be results obtained by manufacturing an insulated gate transistor including a gate insulating layer and an oxide semiconductor layer having thicknesses which allow a short-channel effect to be suppressed and are calculated in Embodiment 3.

Figure 15:
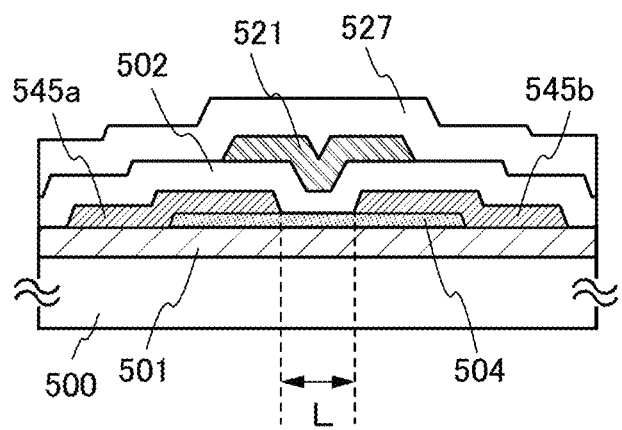
FIG. 15 is a cross-sectional view illustrating a transistor according to an embodiment of the present invention.

In this example, results obtained by evaluating electric characteristics of an insulated gate transistor having a structure illustrated in FIG. 15 will be described. The insulated gate transistor in FIG. 15 is a top-gate top-contact type (called TGTC type) transistor and included, over a substrate 500, a silicon oxide film as an insulating layer 501 serving as a base film; a 30-nm In—Ga—Zn—O film as an oxide semiconductor layer 504; a 50-nm tungsten film as source and drain electrode layers 545a and 545b; a 15-nm silicon oxynitride film as a gate insulating layer 502; a film containing 30-nm tantalum nitride film and 370-nm tungsten film stacked in this order from the gate insulating layer 502 side as a gate electrode layer 521; and a 300-nm silicon oxide film as an interlayer insulating layer 527.

Although not illustrated, as a wiring layer connected to the source electrode layer 545a, the drain electrode layer 545b, and the gate electrode layer 521 through contact holes formed in the interlayer insulating layer, a 50-nm titanium film, a 100-nm aluminum film, and a 5-nm titanium film were formed. Owing to them, electric characteristics of the insulated gate transistor can be easily achieved. Note that L in the drawing denotes channel length.

The method for manufacturing a bottom-gate insulated gate transistor is described in Embodiment 1. Note that a top-gate insulated gate transistor can be manufactured by changing the order of the manufacturing method. Thus, Embodiment 1 can be referred to for the details of the manufacturing method.

As described in Embodiment 3, in order to suppress a short-channel effect so that ΔVth can be less than 0.5 V, the thicknesses of the gate insulating layer and the oxide semiconductor layer are set to 10 nm to 20 nm inclusive and 15 nm to 100 nm inclusive, respectively, or 20 nm to 50 nm inclusive and 15 nm to 30 nm inclusive, respectively, according to the scientific calculation. In the insulated gate transistor evaluated in this example, the thicknesses of the oxide semiconductor layer 504 and the gate insulating layer 502 were set to 30 nm and 15 nm, respectively, and the channel length L and the channel width W were set to 0.8 μm and 10.1 μm, respectively, as an example from the above ranges of thicknesses.

Figure 16:
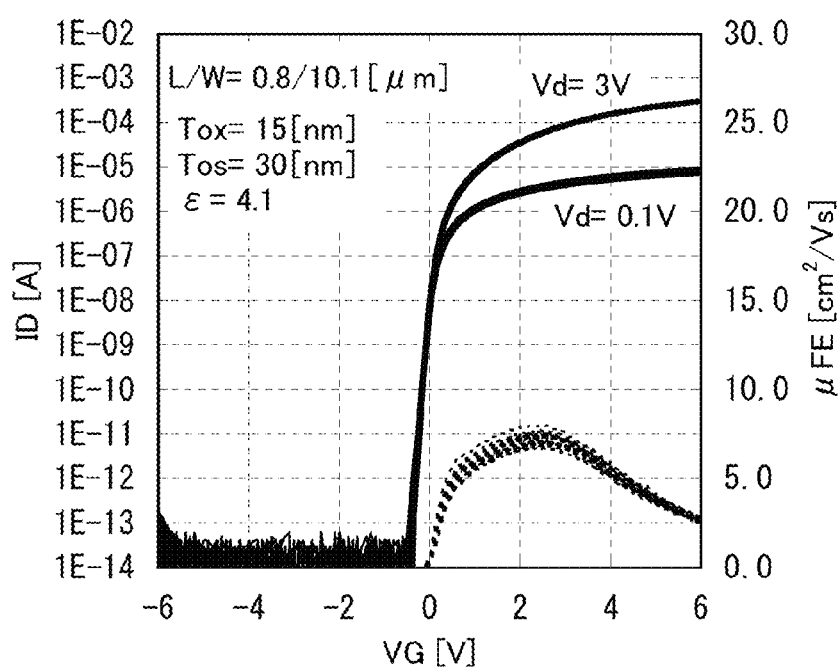
FIG. 16 shows VG-ID characteristics of a transistor according to an embodiment of the present invention.
Figure 17:
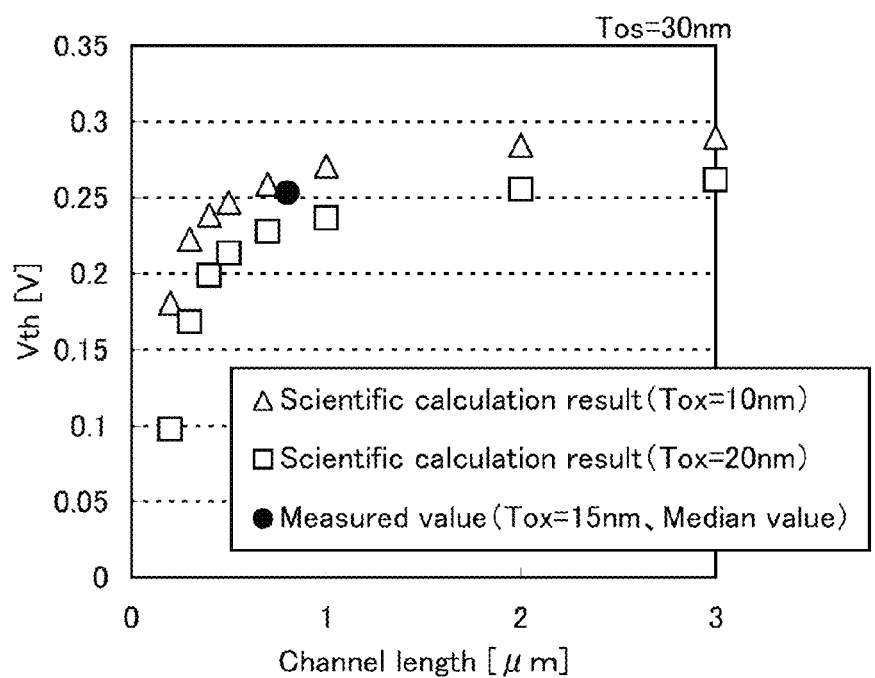
FIG. 17 is a graph where the threshold voltages of a transistor according to an embodiment of the present invention and scientific calculation results are compared.

FIG. 16 shows VG-ID characteristics of 25 insulated gate transistors, which were measured under conditions where the gate voltage is −6 V to +6 V and the drain voltage is 0.1 V or 3 V and which are superimposed on one another. The solid lines show current and the dotted lines show field-effect mobility in the graph. The median and the average of the threshold voltages of these insulated gate transistors were about 0.25 V and about 0.27 V, respectively. By comparing the results with scientific calculation results shown in FIG. 17 (the thickness of a gate insulating layer is 10 nm or 20 nm and the thickness of an oxide semiconductor layer is 30 nm), they are found to be approximate and it was confirmed that a short-channel effect can be suppressed.

This application is based on Japanese Patent Application serial no. 2009-270809 filed with Japan Patent Office on Nov. 27, 2009, the entire contents of which are hereby incorporated by reference.

EXPLANATION OF REFERENCE

400: substrate, 402: gate insulating layer, 404: oxide semiconductor layer, 421: gate electrode layer, 427: oxide insulating layer, 428: insulating layer, 445a: source electrode layer, 445b: drain electrode layer, 500: substrate, 501: insulating layer, 502: gate insulating layer, 504: oxide semiconductor layer, 521: gate electrode layer, 527: interlayer insulating layer, 545a: source electrode layer, 545b: drain electrode layer, 1000: mobile phone, 1001: housing, 1002: display portion, 1003: operation button, 1004: external connection port, 1005: speaker, 1006: microphone, 9400: communication device, 9401: housing, 9402: operation button, 9403: external input terminal, 9404: microphone, 9405: speaker, 9406: light-emitting portion, 9410: display device, 9411: housing, 9412: display portion, 9413: operation button, 9600: television device, 9601: housing, 9603: display portion, 9605: stand, 9607: display portion, 9609: operation key, 9610: remote controller, 9700: digital photo frame, 9701: housing, 9703: display portion, 9881: housing, 9882: display portion, 9883: display portion, 9884: speaker portion, 9885: operation key, 9886: recording medium insert portion, 9887: connection terminal, 9888: sensor, 9889: microphone, 9890: LED lamp, 9891: housing, 9893: joint portion, 9900: slot machine, 9901: housing, and 9903: display portion.

The invention claimed is:

1. A semiconductor device comprising:
   a gate electrode layer;
   a gate insulating layer adjacent to the gate electrode layer; and
   an oxide semiconductor layer adjacent to the gate electrode layer with the gate insulating layer therebetween,
   wherein a carrier concentration of the oxide semiconductor layer is less than $1 \times 10^{12}/cm^3$,
   wherein a length of a channel formed in the oxide semiconductor layer is 3.0 μm or less,
   wherein a thickness of the oxide semiconductor layer is 15 nm to 30 nm,
   wherein the oxide semiconductor layer comprises indium and zinc,
   wherein the oxide semiconductor layer includes a region in which a concentration of hydrogen is $5 \times 10^{19}/cm^3$ or less, and
   wherein an off current per micrometer in a channel width is 100 aA/μm or less when a drain voltage of 1 V to 10 V is applied.

2. The semiconductor device according to claim 1, wherein the length of the channel formed in the oxide semiconductor layer is 0.2 μm or more.

3. The semiconductor device according to claim 1, wherein the gate electrode layer comprises a film containing a metal element selected from aluminum, copper, molybdenum, titanium, chromium, tantalum, tungsten, neodymium, and scandium as its main component; an alloy film; or a stack of any of these films.

4. The semiconductor device according to claim 1, wherein the gate insulating layer comprises a single-layer film or a laminate film of any of silicon oxide, silicon oxynitride, silicon nitride oxide, silicon nitride, aluminum oxide, hafnium oxide, and tantalum oxide.

5. An electronic device comprising the semiconductor device according to claim 1.

6. The semiconductor device according to claim 1, wherein a thickness of the gate insulating layer is 20 nm to 50 nm.

7. A semiconductor device comprising a transistor, the transistor comprising:
   a gate electrode layer;
   a gate insulating layer adjacent to the gate electrode layer; and
   an oxide semiconductor layer adjacent to the gate electrode layer with the gate insulating layer therebetween, wherein a length of a channel formed in the oxide semiconductor layer is 3.0 μm or less, wherein a thickness of the oxide semiconductor layer is 15 nm to 30 nm, wherein the oxide semiconductor layer includes a region in which a concentration of hydrogen is $5\times10^{19}/cm^3$ or less, wherein an off current per micrometer in a channel width is 100 aA/μm or less when a drain voltage of 1 V to 10 V is applied, and wherein the oxide semiconductor layer comprises indium and zinc.

8. The semiconductor device according to claim 7, wherein the length of the channel formed in the oxide semiconductor layer is 0.2 μm or more.

9. The semiconductor device according to claim 7, wherein the gate electrode layer comprises a film containing a metal element selected from aluminum, copper, molybdenum, titanium, chromium, tantalum, tungsten, neodymium, and scandium as its main component; an alloy film; or a stack of any of these films.

10. The semiconductor device according to claim 7, wherein the gate insulating layer comprises a single-layer film or a laminate film of any of silicon oxide, silicon oxynitride, silicon nitride oxide, silicon nitride, aluminum oxide, hafnium oxide, and tantalum oxide.

11. An electronic device comprising the semiconductor device according to claim 7.

12. The semiconductor device according to claim 7, wherein a thickness of the gate insulating layer is 20 nm to 50 nm.

13. A semiconductor device comprising:

an oxide semiconductor layer;

a source electrode layer and a drain electrode layer over the oxide semiconductor layer;

a gate insulating layer over the oxide semiconductor layer, the source electrode layer, and the drain electrode layer; and a gate electrode layer over the gate insulating layer;

wherein the gate electrode layer overlaps the oxide semiconductor layer, the source electrode layer, and the drain electrode layer, wherein a carrier concentration of the oxide semiconductor layer is less than $1\times10^{12}/cm^3$, wherein a length of a channel formed in the oxide semiconductor layer is 3.0 μm or less, wherein a thickness of the oxide semiconductor layer is 15 nm to 30 nm, and wherein the oxide semiconductor layer comprises indium and zinc.

14. The semiconductor device according to claim 13, further comprising an insulating layer, wherein the oxide semiconductor layer is provided over the insulating layer.

15. The semiconductor device according to claim 13, wherein the length of the channel formed in the oxide semiconductor layer is 0.2 μm or more.

16. The semiconductor device according to claim 13, wherein the gate electrode layer comprises a film containing a metal element selected from aluminum, copper, molybdenum, titanium, chromium, tantalum, tungsten, neodymium, and scandium as its main component; an alloy film; or a stack of any of these films.

17. The semiconductor device according to claim 13, wherein the gate insulating layer comprises a single-layer film or a laminate film of any of silicon oxide, silicon oxynitride, silicon nitride oxide, silicon nitride, aluminum oxide, hafnium oxide, and tantalum oxide.

18. An electronic device comprising the semiconductor device according to claim 13.

19. The semiconductor device according to claim 13, wherein a thickness of the gate insulating layer is 20 nm to 50 nm.

* * * * *